US012765359B2

(12) United States Patent
Guler et al.

(10) Patent No.: US 12,765,359 B2
(45) Date of Patent: Oct. 13, 2026

(54) DIELECTRIC PLUGS FOR ADVANCED INTEGRATED CIRCUIT STRUCTURE FABRICATION

(71) Applicant: Intel Corporation, Santa Clara, CA (US)

(72) Inventors: Leonard P. Guler, Hillsboro, OR (US); Robert Joachim, Beaverton, OR (US); Shengsi Liu, Portland, OR (US); Tahir Ghani, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 17/950,926

(22) Filed: Sep. 22, 2022

(65) Prior Publication Data

US 2024/0105597 A1 Mar. 28, 2024

(51) Int. Cl.
*H10W 20/43* (2026.01)
*H10W 20/41* (2026.01)

(52) U.S. Cl.
CPC ......... *H10W 20/43* (2026.01); *H10W 20/425* (2026.01)

(58) Field of Classification Search
CPC ............. H01L 23/528; H01L 23/53238; H01L 21/76897; H01L 21/76834; H10W 20/43; H10W 20/425; H10W 20/069; H10W 20/077
See application file for complete search history.

(56) References Cited

U.S. PATENT DOCUMENTS

| | | | | |
|---|---|---|---|---|
| 10,192,780 | B1 * | 1/2019 | Wang | H01L 21/31144 |
| 2015/0371939 | A1 * | 12/2015 | Yang | H01L 23/53223 257/751 |
| 2019/0081233 | A1 * | 3/2019 | Lee | H10B 61/00 |
| 2020/0343186 | A1 * | 10/2020 | Xie | H01L 21/31116 |
| 2021/0384072 | A1 * | 12/2021 | Jin | H01L 21/76816 |

* cited by examiner

*Primary Examiner* — Jonathan Han
(74) *Attorney, Agent, or Firm* — Schwabe, Williamson & Wyatt, P.C.

(57) ABSTRACT

Embodiments of the disclosure are in the field of integrated circuit structure fabrication. In an example, an integrated circuit structure includes a plurality of conductive lines along a same direction, one of the conductive lines having a break therein. An inter-layer dielectric (ILD) structure has portions between adjacent ones of the plurality of conductive lines and has a dielectric plug portion in a location of the break in the one of the conductive lines. The dielectric plug portion of the ILD structure is continuous with one or more of the portions of the ILD structure between adjacent ones of the plurality of conductive lines. The dielectric plug portion of the ILD structure has an inwardly tapering profile from top to bottom.

18 Claims, 17 Drawing Sheets

400

DIELECTRIC PLUGS FOR ADVANCED INTEGRATED CIRCUIT STRUCTURE FABRICATION

TECHNICAL FIELD

Embodiments of the disclosure are in the field of advanced integrated circuit structure fabrication and, in particular, dielectric plug approaches for integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 15 nanometer node or sub-15 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
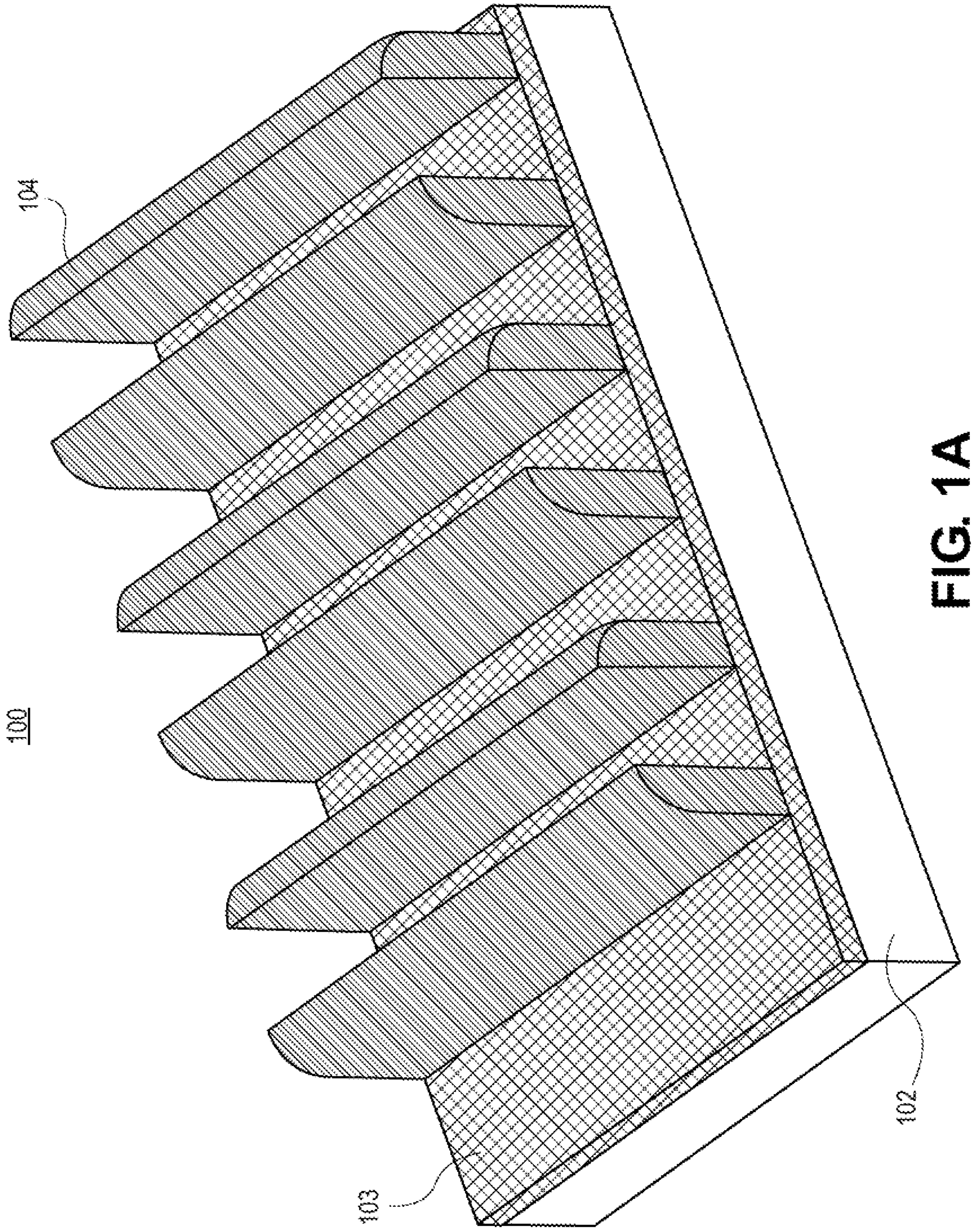
FIGS. 1A-1E, 2, 3, 4 and 5 illustrate cross-sectional views representing various operations in a dielectric plug fabrication approach, in accordance with an embodiment of the present disclosure.

Dielectric plug approaches for integrated circuit structure fabrication, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

It is to be appreciated that FEOL is a technology driver for a given process. In other embodiment, FEOL considerations are driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

Back-end-of-line (BEOL) layers of integrated circuits commonly include electrically conductive microelectronic structures, which are known in the arts as vias, to electrically connect metal lines or other interconnects above the vias to metal lines or other interconnects below the vias. Vias may be formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) or critical dimension uniformity (CDU), or both. Yet another such challenge is that the LWR or CDU, or both, characteristics of photoresists generally need to improve as the critical dimensions of the via openings decrease in order to maintain the same overall fraction of the critical dimension budget.

The above factors are also relevant for considering placement and scaling of non-conductive spaces or interruptions between metal lines (referred to as "plugs," "dielectric plugs" or "metal line ends" among the metal lines of back-end-of-line (BEOL) metal interconnect structures. Thus, improvements are needed in the area of back end metallization manufacturing technologies for fabricating metal lines, metal vias, and dielectric plugs.

One or more embodiments described herein are directed to approaches to enable cut plugs for metal and inter-layer dielectric (ILD) last process flows for metal processes and process window applications.

Embodiments described herein can involve a process initiated by creating a grating where a metal line will ultimately be fabricated. The process involves cutting a grating which will generate metal plugs, adding a shrink liner to increase the metal line CD to desired dimensions, backfilling with dielectric and removal of a dummy grating and replacement with final metal. Embodiments can be implemented to enables very small plug CDs that are not possible with other approaches.

Embodiments described herein can be implemented to fabricate plug processes that are more scalable (e.g., a much smaller plug CD can be achieved with a flow described herein). Embodiments described herein can be implemented to provide much greater plug to metal edge placement error (EPE) margin (process robustness and yield).

As an exemplary processing scheme and as exemplary resulting structures, FIGS. 1A-1E, 2, 3, 4 and 5 illustrate cross-sectional views representing various operations in a dielectric plug fabrication approach, in accordance with an embodiment of the present disclosure.

A grating may be created in a location where metal lines will ultimately be formed. The grating critical dimension (CD) can be sized down to allow more margin for grating cut. Referring to FIG. 1A, a starting structure 100 includes a grating 104 on a hardmask layer 103 on an underlying substrate or dielectric layer 102 (such as an underlying metallization layer or a layer having via structures formed therein. In an embodiment, grating 104 is formed by a pitch-halving or spacer division approach in which an initial amorphous carbon backbone grating of, e.g., 48 nm pitch, is pitch halved by forming amorphous silicon spacers on the backbone, and then removing the backbone to provide an amorphous silicon grating. In an embodiment, grating 104 defines the position of the final metal lines, and the sizing down provides edge placement error (EPE) margin for subsequent operations.

Figure 1B:
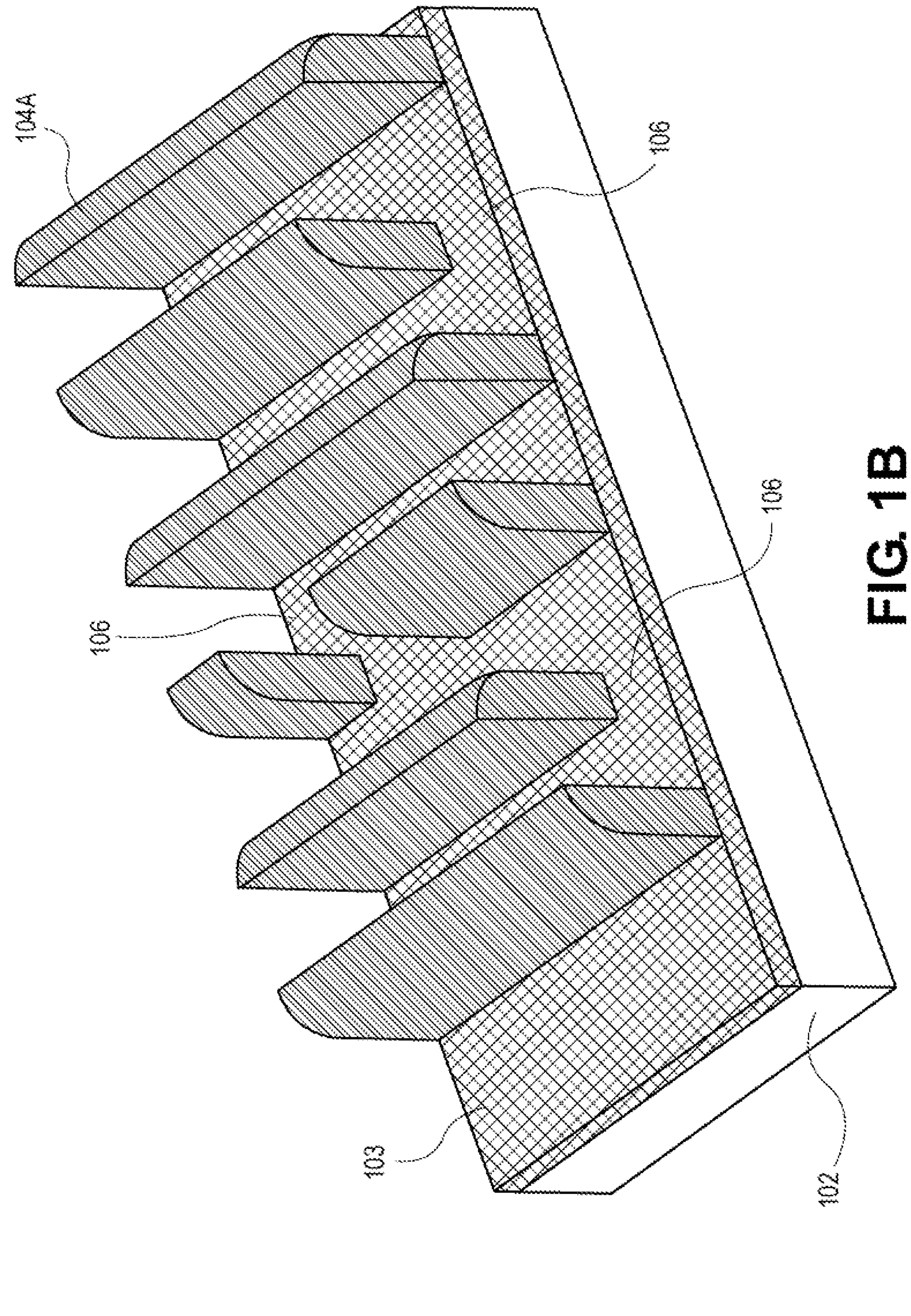

Referring to FIG. 1B, the grating 104 is subjected to a cut process. For example, a masking layer can be formed over the structure 100, and an etch process is performed to provide cut grating 104A having gaps 106 therein. In an embodiment, the etch process is performed in locations where dielectric plugs for metal lines will ultimately be formed.

Figure 1C:
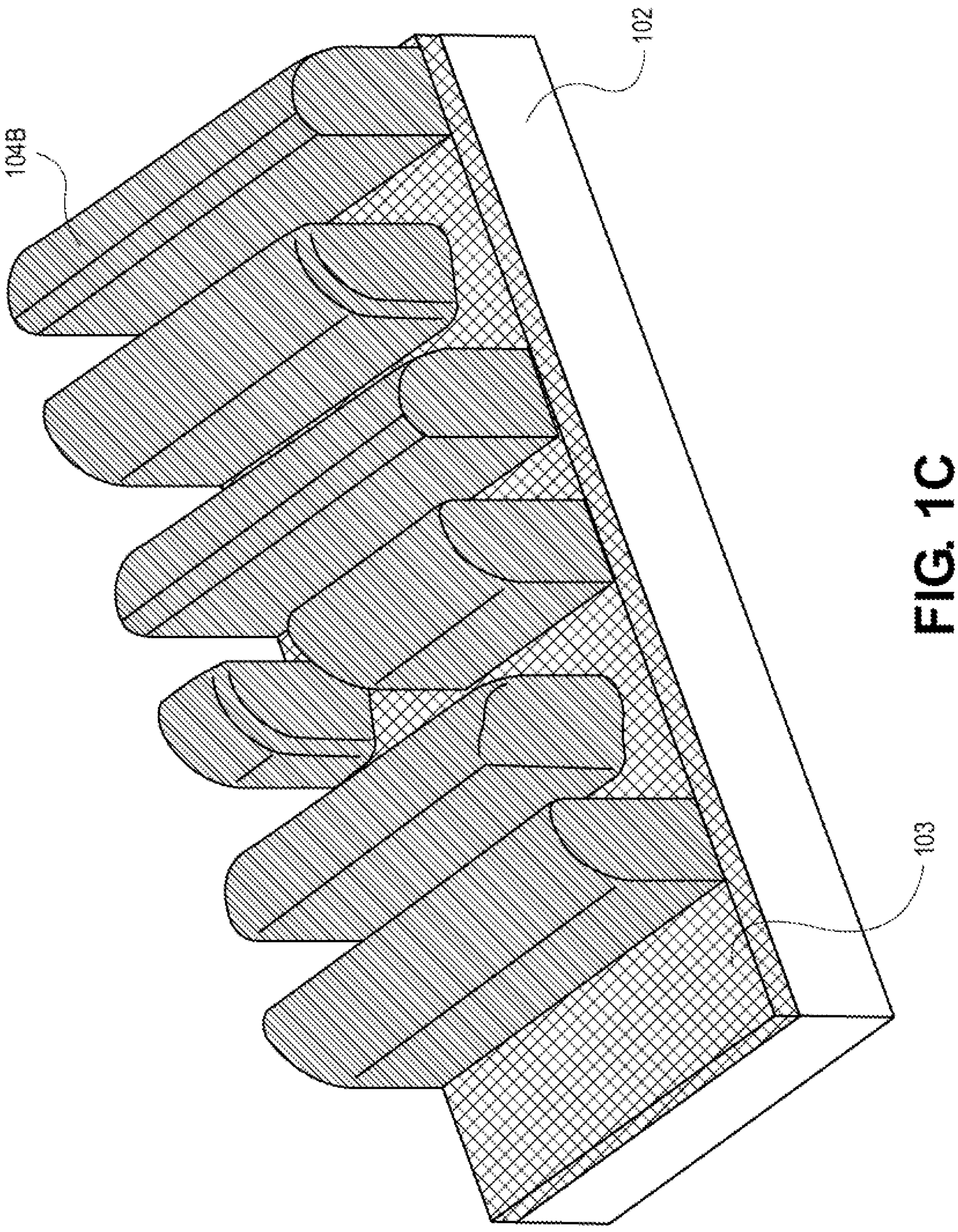

Subsequent to the cut process, the grating size can be increased with a same or similar material as the original grating material to achieve a grating CD that is equal to a final metal width. The grating CD increase can also decrease the final plug CD. Referring to FIG. 1C, the grating 104A is subjected to a deposition process to effectively grow to form grating 104B. In an embodiment, this process operation can be referred to as forming an EPE liner/CD adjustment liner (and can be a same material as 104). In one embodiment, this process operation puts CD back on target for both plug and metal line dimensions.

Figure 1D:
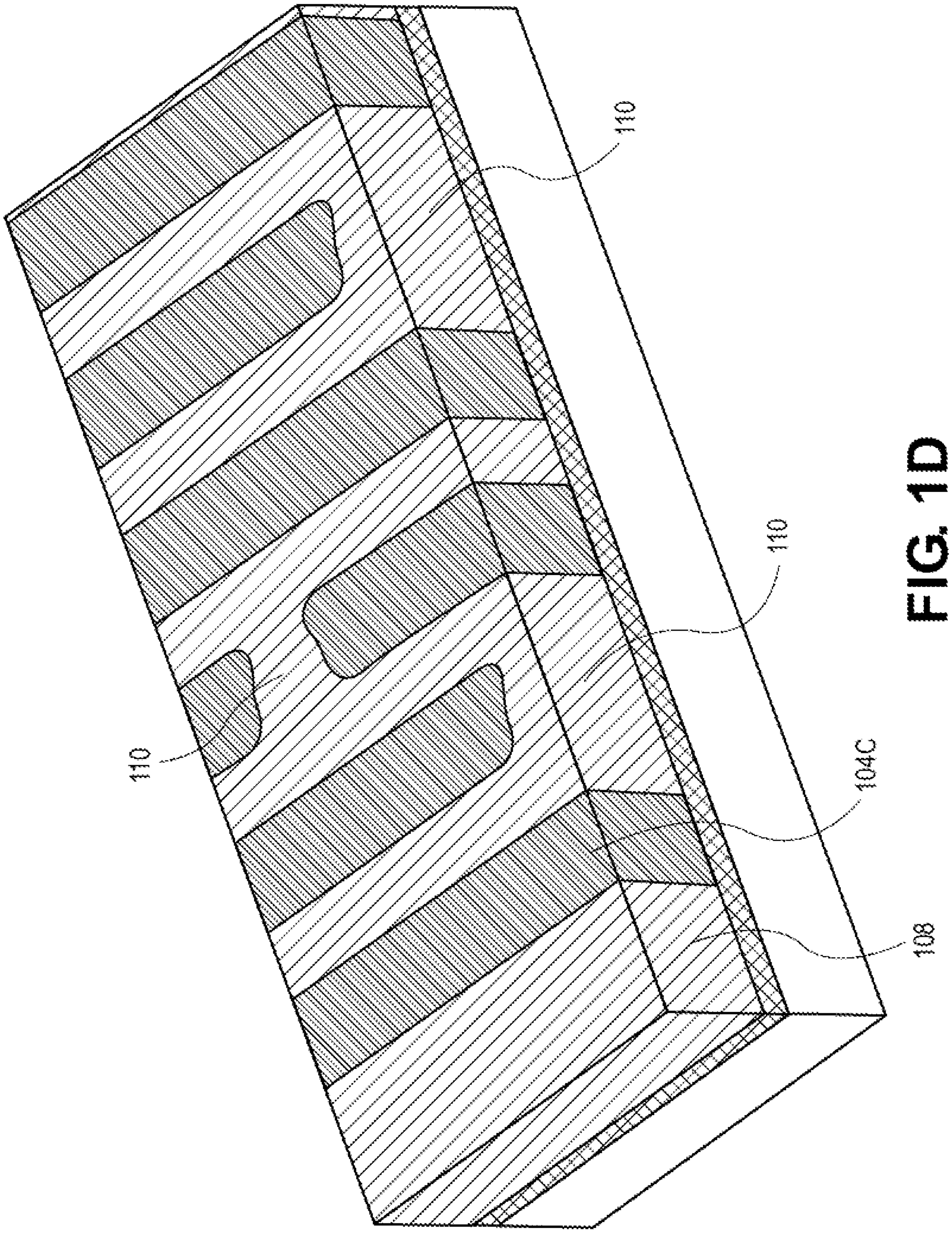

Subsequent to the growth process, the grating can be back-filled with a dielectric material, such as an inter-layer dielectric material, and polished to expose the sacrificial grating. Referring to FIG. 1D, a dielectric material is formed over the structure of FIG. 1C, and the resulting structure is planarized to provide planarized grating 104C having a dielectric structure 108 therein. The dielectric structure 108 occupies locations between features of the planarized grating 104C and in plug locations 106 to form plugs 110.

Figure 1E:
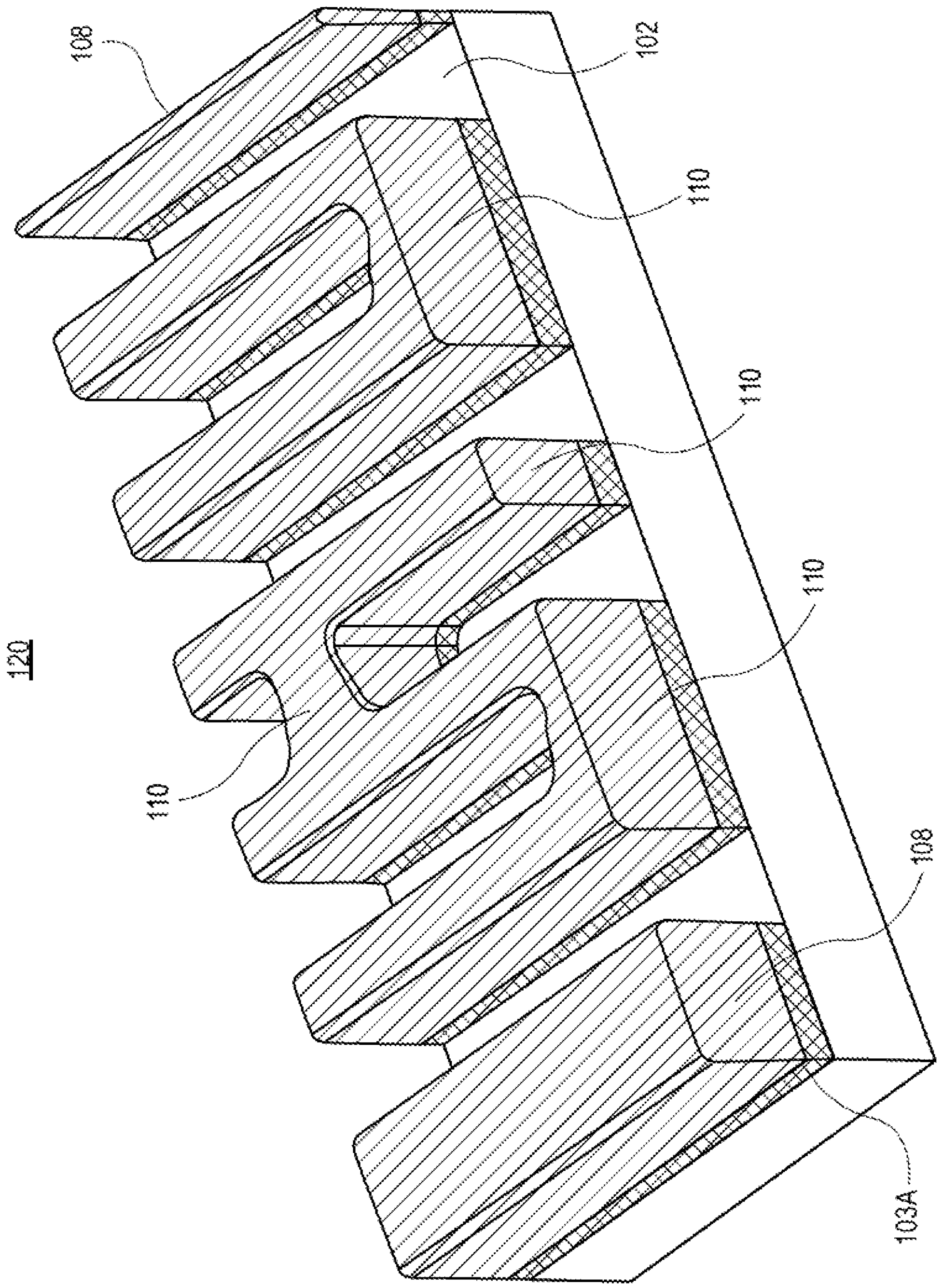

Subsequently, the sacrificial grating can be replaced by final metal material. Referring to FIG. 1E, the planarized grating 104C is removed to leave the dielectric structure 108 as remaining. Additionally, exposed portion of hardmask 103 can be removed to form patterned hardmask 103A, as is depicted.

Figure 2:
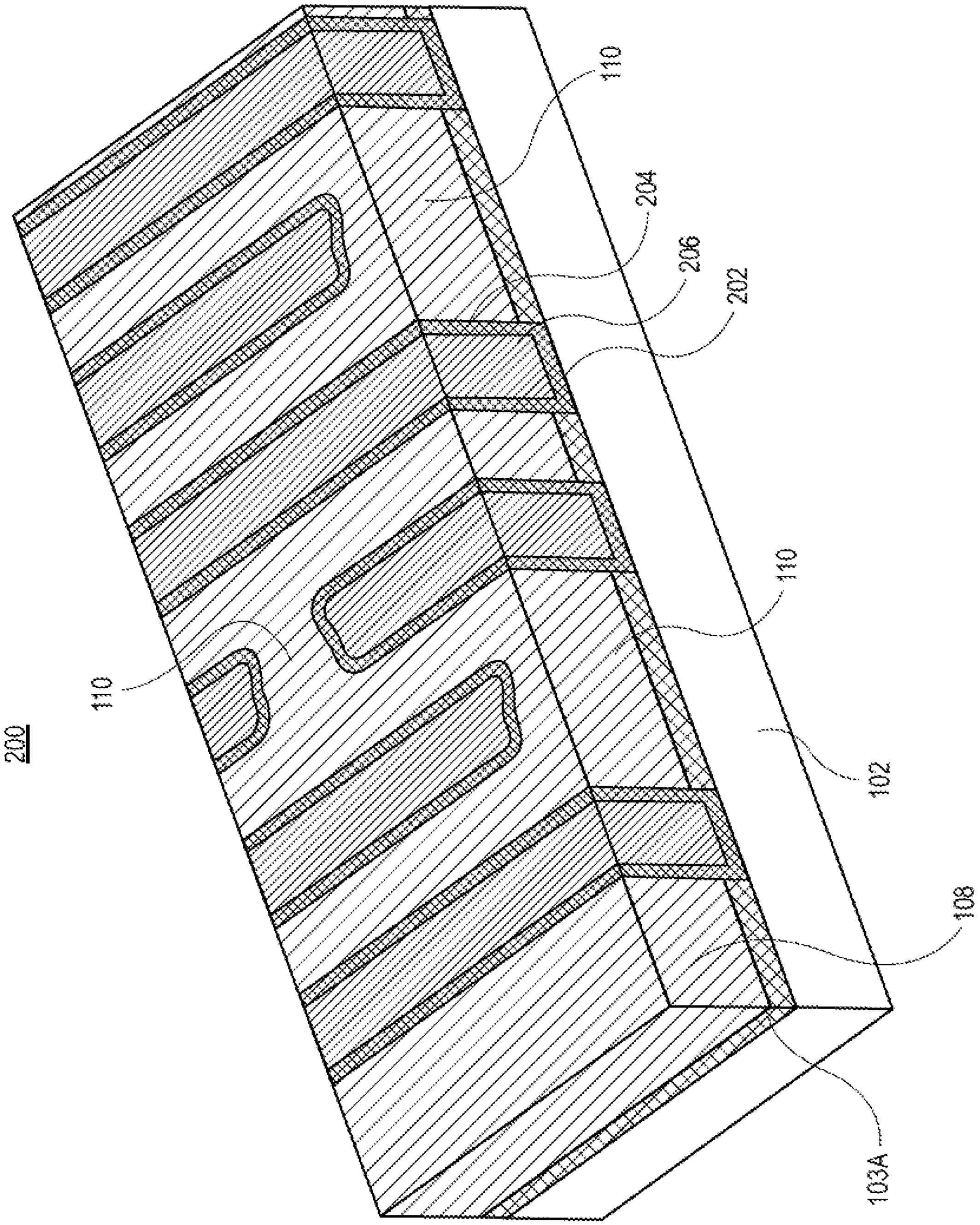

Referring to FIG. 2, a structure 200 is provided by forming conductive structures 202 in locations previously occupied by the planarized grating 104C, e.g., by a deposition and planarization process. In one embodiment, the conductive structures 202 include a conductive barrier 204 and conductive fill 206. In an embodiment, conductive structures 202 are a plurality of conductive lines along a same direction. Some of the conductive lines can have breaks therein as interrupted by portions of the dielectric structure 108 which effectively act as dielectric plugs 110 in those locations. Although not depicted, in one embodiment, the conductive lines are aligned with underlying vias in an underlying metallization layer.

Figure 3:
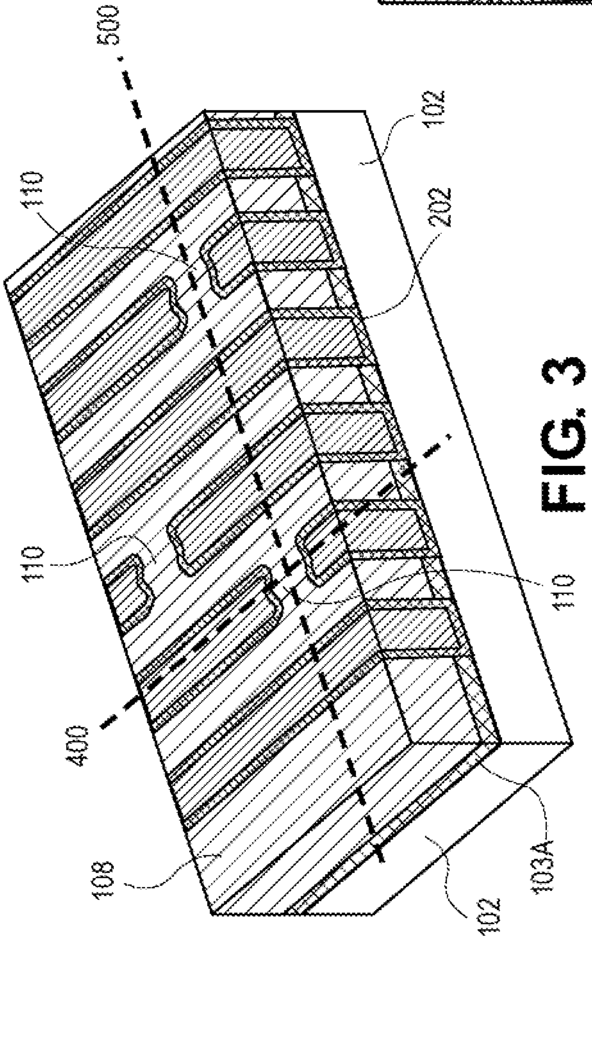

It is to be appreciated that artifacts of the above process may remain in a final product. Referring to FIG. 3, a structure 300 is similar to a structure such as described in association with FIGS. 1A-1E and 2, i.e., with a dielectric structure including dielectric plugs 110 between conductive features 202. The dashed lines represent locations where (a) a cross-section location is shown for FIG. 4, and (b) a cross-section location is shown for FIG. 5.

Figure 4:
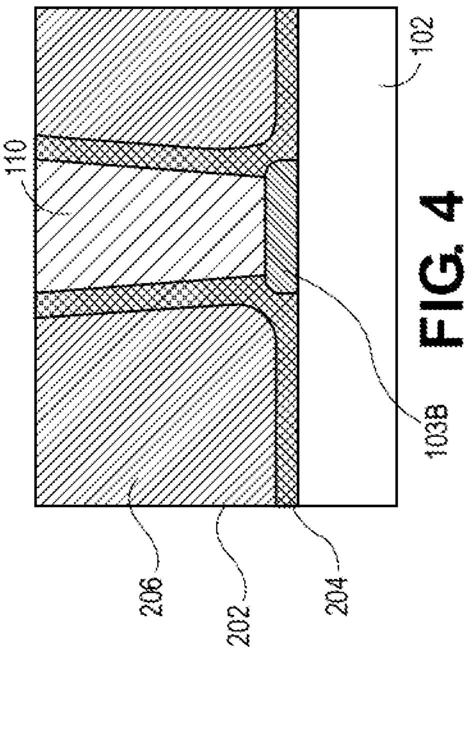

Referring to structure 400 of FIG. 4, a dielectric plug 110 is shown between two conductive structure portions 202. The dielectric plug 110 is on a remaining portion 103B of the hardmask 103. In one embodiment, dielectric plug 110 has an inwardly tapering profile from top to bottom. In a specific embodiment, dielectric plug 110 has an inwardly tapering profile from top to bottom since it occupies a location between regions previously occupied by etched grating ends (i.e., locations 106).

Figure 5:
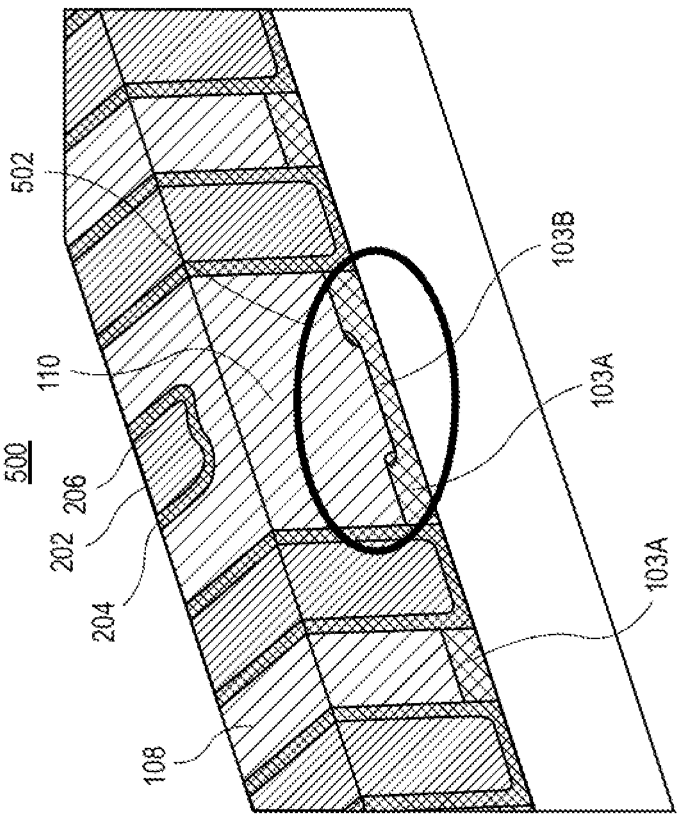

Referring to structure 500 of FIG. 5, a dielectric plug 110 is shown at an end of a conductive feature and between portions of dielectric structure 108 between adjacent conductive lines. In one embodiment, dielectric plug 110 is on a portion 103B of hardmask 103 that is thinner than the portion 103A beneath the portion of dielectric structure 108 between adjacent lines. In one embodiment, portion 103B is thinner than portion 103A since the hardmask 103 was subjected to an additional etch in that location, e.g., subjected to the etch to form plug locations 106. In one embodiment, such an etch stop punch under the plug indicates that the grating was cut. By contrast, if a plug process was transferred from a previous layer there would not be a recess under the plug but rather everywhere else.

With reference again to FIGS. 2, 3, 4 and 5, in accordance with an embodiment of the present disclosure, an integrated circuit structure includes a plurality of conductive lines 202 along a same direction, one of the conductive lines 202 having a break therein. An inter-layer dielectric (ILD) structure 108 has portions between adjacent ones of the plurality of conductive lines and has a dielectric plug portion 110 in a location of the break in the one of the conductive lines 202. The dielectric plug portion 110 of the ILD structure 108 is continuous with one or more of the portions of the ILD structure 108 between adjacent ones of the plurality of conductive lines 202.

In an embodiment, the dielectric plug portion 110 of the ILD structure 108 has an inwardly tapering profile from top to bottom. In an embodiment, the plurality of conductive lines 202 includes a conductive barrier 204 and a conductive fill 206.

In an embodiment, the ILD structure 108 is on a dielectric hardmask layer 103A/103B. In one embodiment, the dielectric hardmask layer 103B extends laterally beyond the bottom of the dielectric plug portion 110 of the ILD structure 108, e.g., as is depicted in FIG. 4. In one embodiment, the dielectric plug portion 110 of the ILD structure 108 is on a portion 103B of the dielectric hardmask layer having a first thickness, the portions of the ILD structure 108 between adjacent ones of the plurality of conductive lines 202 are on a portion 103A of the dielectric hardmask layer having a second thickness, the second thickness greater than the first thickness, e.g., as is depicted in region 502 of FIG. 5. In one embodiment, the dielectric hardmask layer 103A/103B includes silicon, nitrogen and oxygen.

To provide further context, with every technology node, the need for finer features such as thinner metal lines and vias spaced at fine pitches continues. A combination of optics and self-aligned schemes have sustained the industry by providing the needed lithographic plus patterning solutions for lines. Extreme ultraviolet (EUV) technology has recently allowed a big change in printable via and pattern sizes. Even so, EUV printing may not be sufficient to meet the need for scaling of technology nodes. Deposition and/or etch based solutions may be needed that can complement the EUV printing and meet the technology gap. Typical state of the art EUV technology yields a via or a trench pattern which can be significantly larger than the actual width needed in the dielectric. This can occur when the lithographic limit is reached which is an outcome of interactions between the source, optics and photoresist materials.

In another aspect, a pitch quartering approach is implemented for fabricating a grating such as described above for forming BEOL interconnect structures. In accordance with an embodiment of the present disclosure, pitch division is applied for fabricating metal lines in a BEOL fabrication scheme. Embodiments may enable continued scaling of the pitch of metal layers beyond the resolution capability of state-of-the art lithography equipment.

Figure 6:
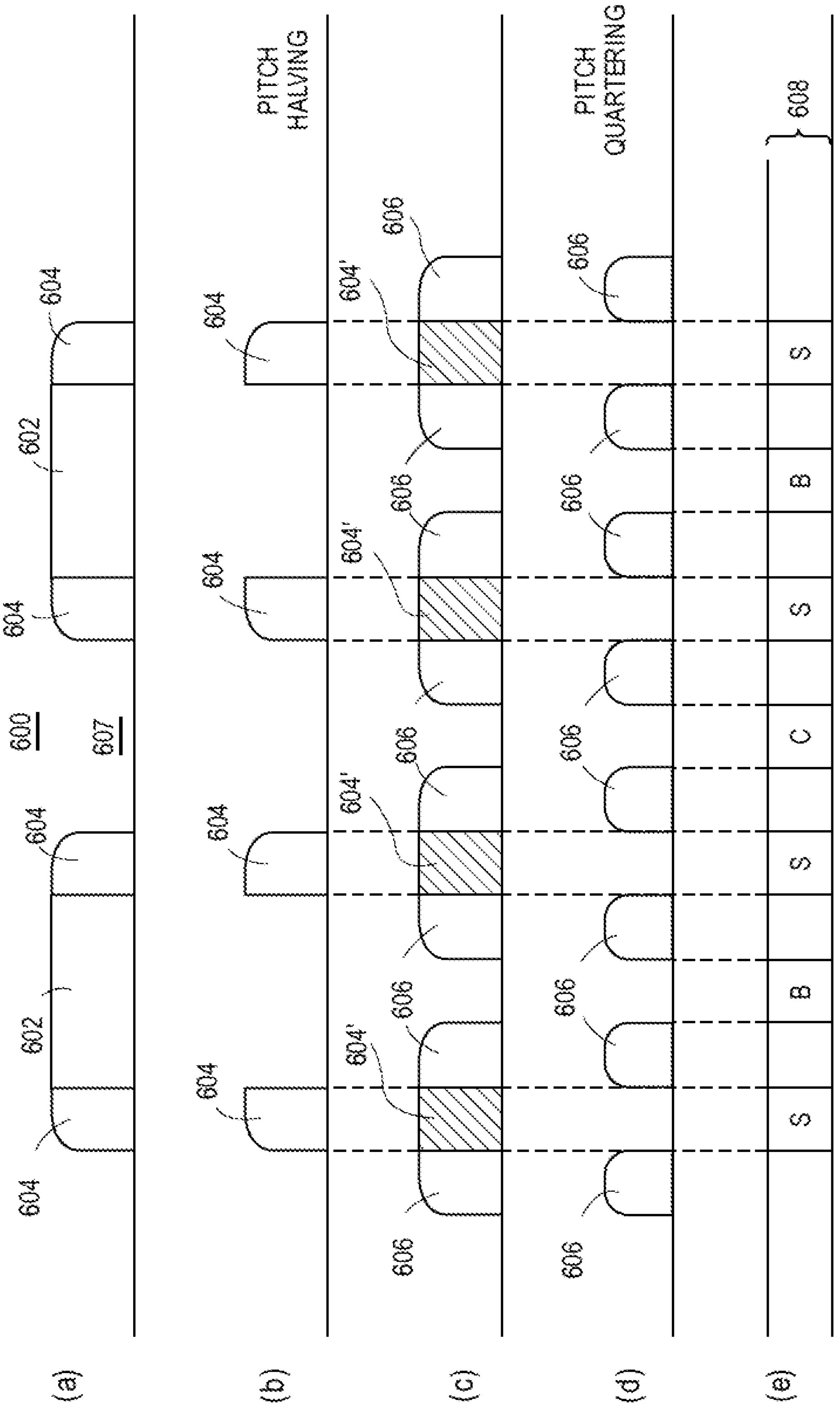
FIG. 6 is a schematic of a pitch quartering approach used to fabricate trenches for interconnect structures, in accordance with an embodiment of the present disclosure.

FIG. 6 is a schematic of a pitch quartering approach 600 used to fabricate grating structure for ultimately forming interconnect structures, in accordance with an embodiment of the present disclosure.

Referring to FIG. 6, at operation (a), backbone features 602 are formed using direct lithography. For example, a photoresist layer or stack may be patterned and the pattern transferred into a hardmask material to ultimately form backbone features 602. The photoresist layer or stack used to form backbone features 602 may be patterned using standard lithographic processing techniques, such as 193 immersion lithography. First spacer features 604 are then formed adjacent the sidewalls of the backbone features 602.

At operation (b), the backbone features 602 are removed to leave only the first spacer features 604 remaining. At this stage, the first spacer features 604 are effectively a half pitch mask, e.g., representing a pitch halving process. The first spacer features 604 can either be used directly for a pitch quartering process, or the pattern of the first spacer features 604 may first be transferred into a new hardmask material, where the latter approach is depicted.

At operation (c), the pattern of the first spacer features 604 transferred into a new hardmask material to form first spacer features 604'. Second spacer features 606 are then formed adjacent the sidewalls of the first spacer features 604'.

At operation (d), the first spacer features 604' are removed to leave only the second spacer features 606 remaining. At this stage, the second spacer features 606 are effectively a quarter pitch mask, e.g., representing a pitch quartering process.

At operation (e), the second spacer features 606 are used as a grating structure to ultimately form a plurality of trenches 608 in a dielectric or hardmask layer. The trenches may ultimately be filled with conductive material to form conductive interconnects in metallization layers of an integrated circuit. Trenches 608 having the label "B" correspond to backbone features 602. Trenches 608 having the label "S" correspond to first spacer features 604 or 604'. Trenches 608 having the label "C" correspond to a complementary region 607 between backbone features 602.

It is to be appreciated that since individual ones of the trenches 608 of FIG. 6 have a patterning origin that corresponds to one of backbone features 602, first spacer features 604 or 604', or complementary region 607 of FIG. 6, differences in width and/or pitch of such features may appear as artifacts of a pitch quartering process in ultimately formed conductive interconnects in metallization layers of an integrated circuit. As an example, FIG. 7A illustrates a cross-sectional view of a metallization layer fabricated using pitch quartering scheme, in accordance with an embodiment of the present disclosure.

Figure 7A:
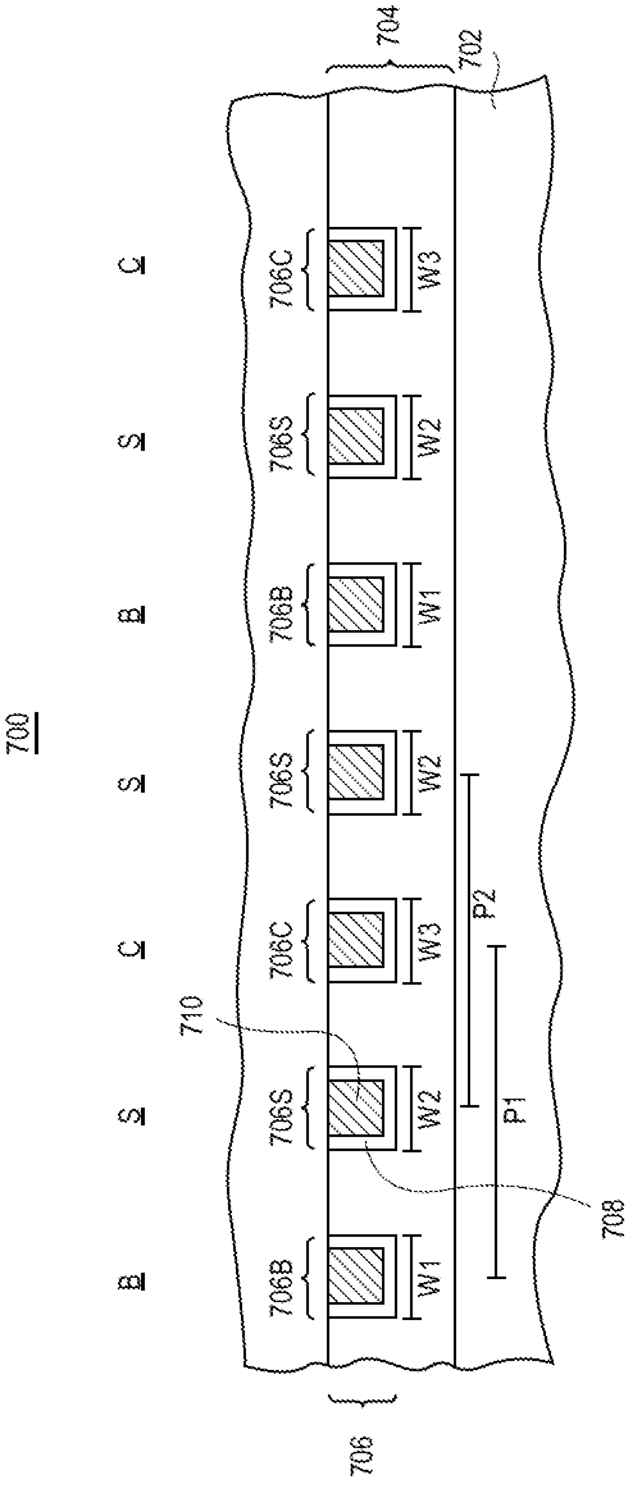
FIG. 7A illustrates a cross-sectional view of a metallization layer fabricated using pitch quartering scheme, in accordance with an embodiment of the present disclosure.

Referring to FIG. 7A, an integrated circuit structure 700 includes an inter-layer dielectric (ILD) layer 704 above a substrate 702. A plurality of conductive interconnect lines 706 is in the ILD layer 704, and individual ones of the plurality of conductive interconnect lines 706 are spaced apart from one another by portions of the ILD layer 704. Individual ones of the plurality of conductive interconnect lines 706 includes a conductive barrier layer 708 and a conductive fill material 710.

With reference to both FIGS. 6 and 7A, conductive interconnect lines 706B are formed in trenches with a pattern originating from backbone features 602. Conductive interconnect lines 706S are formed in trenches with a pattern originating from first spacer features 604 or 604'. Conductive interconnect lines 706C are formed in trenches with a pattern originating from complementary region 607 between backbone features 602.

Referring again to FIG. 7A, in an embodiment, the plurality of conductive interconnect lines 706 includes a first interconnect line 706B having a width (W1). A second interconnect line 706S is immediately adjacent the first interconnect line 706B, the second interconnect line 706S having a width (W2) different than the width (W1) of the first interconnect line 706B. A third interconnect line 706C is immediately adjacent the second interconnect line 706S, the third interconnect line 706C having a width (W3). A fourth interconnect line (second 706S) immediately adjacent the third interconnect line 706C, the fourth interconnect line having a width (W2) the same as the width (W2) of the second interconnect line 706S. A fifth interconnect line (second 706B) is immediately adjacent the fourth interconnect line (second 706S), the fifth interconnect line (second 706B) having a width (W1) the same as the width (W1) of the first interconnect line 706B.

In an embodiment, the width (W3) of the third interconnect line 706C is different than the width (W1) of the first interconnect line 706B. In one such embodiment, the width (W3) of the third interconnect line 706C is different than the width (W2) of the second interconnect line 706S. In another such embodiment, the width (W3) of the third interconnect line 706C is the same as the width (W2) of the second interconnect line 706S. In another embodiment, the width (W3) of the third interconnect line 706C is the same as the width (W1) of the first interconnect line 706B.

In an embodiment, a pitch (P1) between the first interconnect line 706B and the third interconnect line 706C is the same as a pitch (P2) between the second interconnect 706S line and the fourth interconnect line (second 706S). In another embodiment, a pitch (P1) between the first interconnect line 706B and the third interconnect line 706C is different than a pitch (P2) between the second interconnect line 706S and the fourth interconnect line (second 706S).

Referring again to FIG. 7A, in another embodiment, the plurality of conductive interconnect lines 706 includes a first interconnect line 706B having a width (W1). A second interconnect line 706S is immediately adjacent the first interconnect line 706B, the second interconnect line 706S having a width (W2). A third interconnect line 706C is immediately adjacent the second interconnect line 706S, the third interconnect line 706C having a width (W3) different than the width (W1) of the first interconnect line 706B. A fourth interconnect line (second 706S) is immediately adjacent the third interconnect line 706C, the fourth interconnect line having a width (W2) the same as the width (W2) of the second interconnect line 706S. A fifth interconnect line (second 706B) is immediately adjacent the fourth interconnect line (second 706S), the fifth interconnect line (second 706B) having a width (W1) the same as the width (W1) of the first interconnect line 706B.

In an embodiment, the width (W2) of the second interconnect line 706S is different than the width (W1) of the first interconnect line 706B. In one such embodiment, the width (W3) of the third interconnect line 706C is different than the width (W2) of the second interconnect line 706S. In another such embodiment, the width (W3) of the third interconnect line 706C is the same as the width (W2) of the second interconnect line 706S.

In an embodiment, the width (W2) of the second interconnect line 706S is the same as the width (W1) of the first interconnect line 706B. In an embodiment, a pitch (P1) between the first interconnect line 706B and the third interconnect line 706C is the same as a pitch (P2) between the second interconnect line 706S and the fourth interconnect line (second 706S). In an embodiment, a pitch (P1) between the first interconnect line 706B and the third interconnect line 706C is different than a pitch (P2) between the second interconnect line 706S and the fourth interconnect line (second 706S).

Figure 7B:
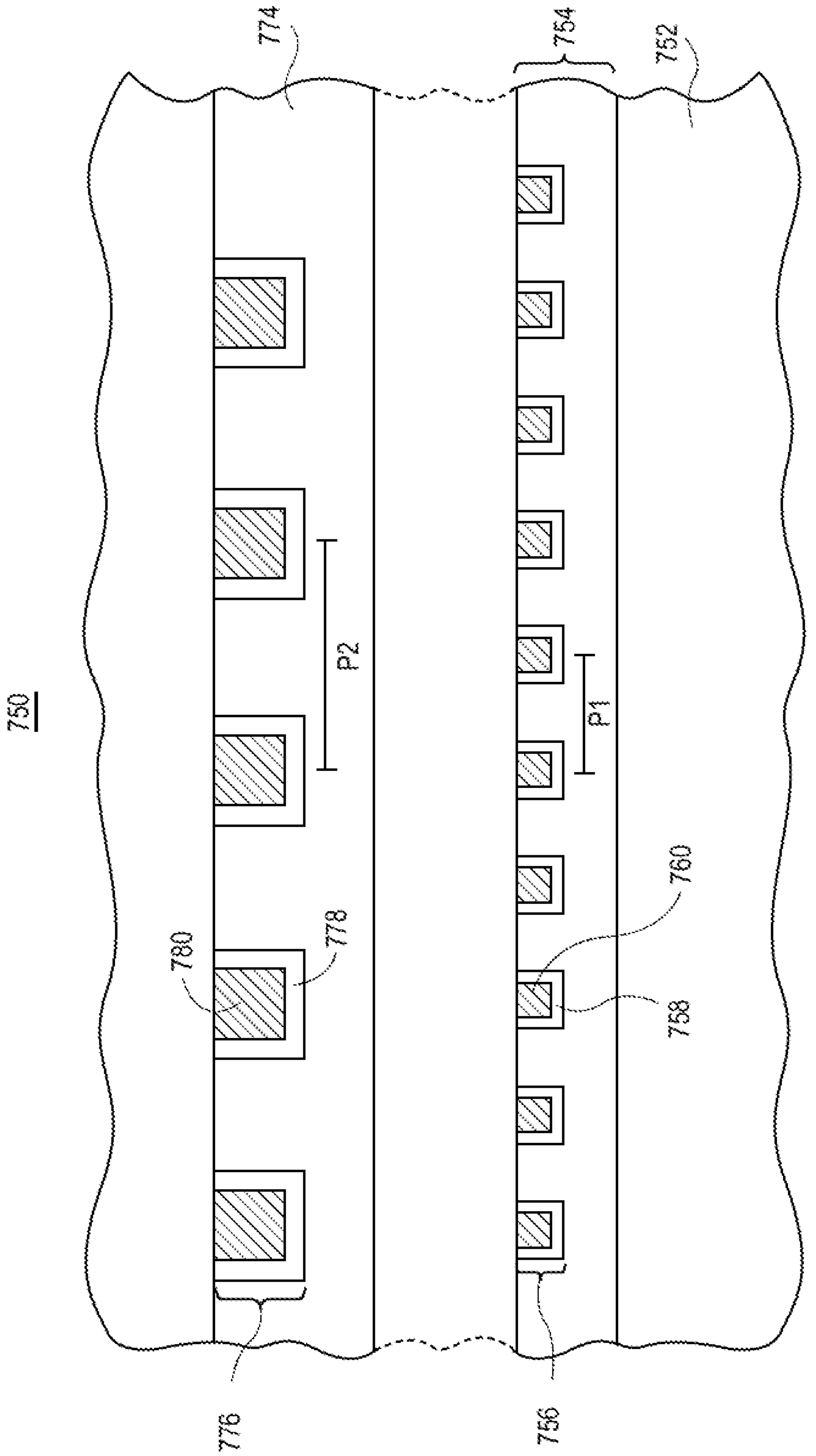
FIG. 7B illustrates a cross-sectional view of a metallization layer fabricated using pitch halving scheme above a metallization layer fabricated using pitch quartering scheme, in accordance with an embodiment of the present disclosure.

FIG. 7B illustrates a cross-sectional view of a metallization layer fabricated using pitch halving scheme above a metallization layer fabricated using pitch quartering scheme, in accordance with an embodiment of the present disclosure.

Referring to FIG. 7B, an integrated circuit structure 750 includes a first inter-layer dielectric (ILD) layer 754 above a substrate 752. A first plurality of conductive interconnect lines 756 is in the first ILD layer 754, and individual ones of the first plurality of conductive interconnect lines 756 are spaced apart from one another by portions of the first ILD layer 754. Individual ones of the plurality of conductive interconnect lines 756 includes a conductive barrier layer 758 and a conductive fill material 760. The integrated circuit structure 750 further includes a second inter-layer dielectric (ILD) layer 774 above substrate 752. A second plurality of conductive interconnect lines 776 is in the second ILD layer 774, and individual ones of the second plurality of conductive interconnect lines 776 are spaced apart from one another by portions of the second ILD layer 774. Individual ones of the plurality of conductive interconnect lines 776 includes a conductive barrier layer 778 and a conductive fill material 780.

In accordance with an embodiment of the present disclosure, with reference again to FIG. 7B, a method of fabricating an integrated circuit structure includes forming a first plurality of conductive interconnect lines 756 in and spaced apart by a first inter-layer dielectric (ILD) layer 754 above a substrate 752. The first plurality of conductive interconnect lines 756 is formed using a spacer-based pitch quartering process, e.g., the approach described in association with operations (a)-(e) of FIG. 6. A second plurality of conductive interconnect lines 776 is formed in and is spaced apart by a second ILD layer 774 above the first ILD layer 754. The second plurality of conductive interconnect lines 776 is formed using a spacer-based pitch halving process, e.g., the approach described in association with operations (a) and (b) of FIG. 6.

In an embodiment, first plurality of conductive interconnect lines 756 has a pitch (P1) between immediately adjacent lines of than 40 nanometers. The second plurality of conductive interconnect lines 776 has a pitch (P2) between immediately adjacent lines of 44 nanometers or greater. In an embodiment, the spacer-based pitch quartering process and the spacer-based pitch halving process are based on an immersion 193 nm lithography process.

In an embodiment, individual ones of the first plurality of conductive interconnect lines 754 include a first conductive barrier liner 758 and a first conductive fill material 760. Individual ones of the second plurality of conductive interconnect lines 756 include a second conductive barrier liner 778 and a second conductive fill material 780. In one such embodiment, the first conductive fill material 760 is different in composition from the second conductive fill material 780. In another embodiment, the first conductive fill material 760 is the same in composition as the second conductive fill material 780.

Although not depicted, in an embodiment, the method further includes forming a third plurality of conductive interconnect lines in and spaced apart by a third ILD layer above the second ILD layer 774. The third plurality of conductive interconnect lines is formed without using pitch division.

Although not depicted, in an embodiment, the method further includes, prior to forming the second plurality of conductive interconnect lines 776, forming a third plurality of conductive interconnect lines in and spaced apart by a third ILD layer above the first ILD layer 754. The third plurality of conductive interconnect lines is formed using a spacer-based pitch quartering process. In one such embodiment, subsequent to forming the second plurality of conductive interconnect lines 776, a fourth plurality of conductive interconnect lines is formed in and is spaced apart by a fourth ILD layer above the second ILD layer 774. The fourth plurality of conductive interconnect lines is formed using a spacer-based pitch halving process. In an embodiment, such a method further includes forming a fifth plurality of conductive interconnect lines in and spaced apart by a fifth ILD layer above the fourth ILD layer, the fifth plurality of conductive interconnect lines formed using a spacer-based pitch halving process. A sixth plurality of conductive interconnect lines is then formed in and spaced apart by a sixth ILD layer above the fifth ILD layer, the sixth plurality of conductive interconnect lines formed using a spacer-based pitch halving process. A seventh plurality of conductive interconnect lines is then formed in and spaced apart by a seventh ILD layer above the sixth ILD layer. The seventh plurality of conductive interconnect lines is formed without using pitch division.

In another aspect, metal line compositions vary between metallization layers. Such an arrangement may be referred to as heterogeneous metallization layers. In an embodiment, copper is used as a conductive fill material for relatively larger interconnect lines, while cobalt is used as a conductive fill material for relatively smaller interconnect lines. The smaller lines having cobalt as a fill material may provide reduced electromigration while maintaining low resistivity.

The use of cobalt in place of copper for smaller interconnect lines may address issues with scaling copper lines, where a conductive barrier layer consumes a greater amount of an interconnect volume and copper is reduced, essentially hindering advantages normally associated with a copper interconnect line.

Figure 8A:
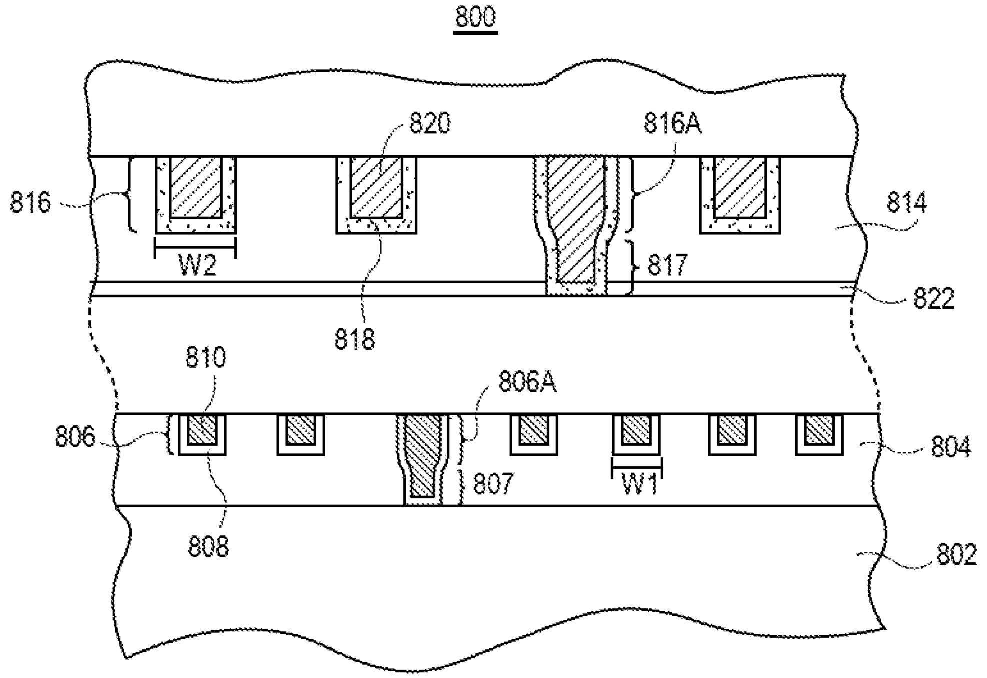
FIG. 8A illustrates a cross-sectional view of an integrated circuit structure having a metallization layer with a metal line composition above a metallization layer with a differing metal line composition, in accordance with an embodiment of the present disclosure.

In a first example, FIG. 8A illustrates a cross-sectional view of an integrated circuit structure having a metallization layer with a metal line composition above a metallization layer with a differing metal line composition, in accordance with an embodiment of the present disclosure.

Referring to FIG. 8A, an integrated circuit structure 800 includes a first plurality of conductive interconnect lines 806 in and spaced apart by a first inter-layer dielectric (ILD) layer 804 above a substrate 802. One of the conductive interconnect lines 806A is shown as having an underlying via 807. Individual ones of the first plurality of conductive interconnect lines 806 include a first conductive barrier material 808 along sidewalls and a bottom of a first conductive fill material 810.

A second plurality of conductive interconnect lines 816 is in and spaced apart by a second ILD layer 814 above the first ILD layer 804. One of the conductive interconnect lines 816A is shown as having an underlying via 817. Individual ones of the second plurality of conductive interconnect lines 816 include a second conductive barrier material 818 along sidewalls and a bottom of a second conductive fill material 820. The second conductive fill material 820 is different in composition from the first conductive fill material 810.

In an embodiment, the second conductive fill material 820 consists essentially of copper, and the first conductive fill material 810 consists essentially of cobalt. In one such embodiment, the first conductive barrier material 808 is different in composition from the second conductive barrier material 818. In another such embodiment, the first conductive barrier material 808 is the same in composition as the second conductive barrier material 818.

In an embodiment, the first conductive fill material 810 includes copper having a first concentration of a dopant impurity atom, and the second conductive fill material 820 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 808 and the second conductive barrier material 818 have the same composition. In an embodiment, the first conductive barrier material 808 and the second conductive barrier material 818 have a different composition.

Referring again to FIG. 8A, the second ILD layer 814 is on an etch-stop layer 822. The conductive via 817 is in the second ILD layer 814 and in an opening of the etch-stop layer 822. In an embodiment, the first and second ILD layers 804 and 814 include silicon, carbon and oxygen, and the etch-stop layer 822 includes silicon and nitrogen. In an embodiment, individual ones of the first plurality of conductive interconnect lines 806 have a first width (W1), and individual ones of the second plurality of conductive interconnect lines 816 have a second width (W2) greater than the first width (W1).

Figure 8B:
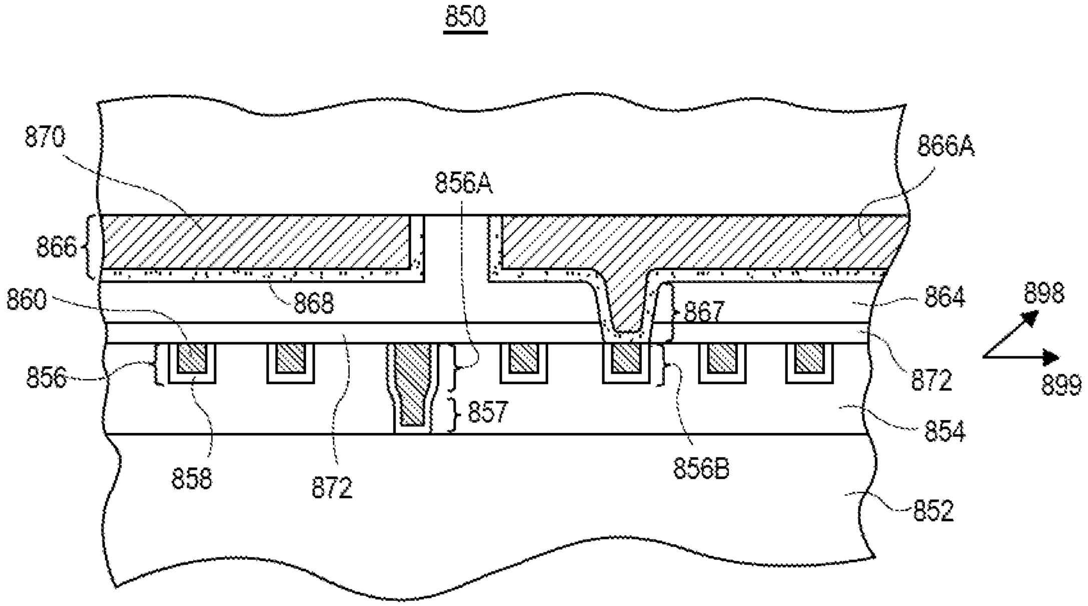
FIG. 8B illustrates a cross-sectional view of an integrated circuit structure having a metallization layer with a metal line composition coupled to a metallization layer with a differing metal line composition, in accordance with an embodiment of the present disclosure.

In a second example, FIG. 8B illustrates a cross-sectional view of an integrated circuit structure having a metallization layer with a metal line composition coupled to a metallization layer with a differing metal line composition, in accordance with an embodiment of the present disclosure.

Referring to FIG. 8B, an integrated circuit structure 850 includes a first plurality of conductive interconnect lines 856 in and spaced apart by a first inter-layer dielectric (ILD) layer 854 above a substrate 852. One of the conductive interconnect lines 856A is shown as having an underlying via 857. Individual ones of the first plurality of conductive interconnect lines 856 include a first conductive barrier material 858 along sidewalls and a bottom of a first conductive fill material 860.

A second plurality of conductive interconnect lines 866 is in and spaced apart by a second ILD layer 864 above the first ILD layer 854. One of the conductive interconnect lines 866A is shown as having an underlying via 867. Individual ones of the second plurality of conductive interconnect lines 866 include a second conductive barrier material 868 along sidewalls and a bottom of a second conductive fill material 870. The second conductive fill material 870 is different in composition from the first conductive fill material 860.

In an embodiment, the conductive via 867 is on and electrically coupled to an individual one 856B of the first plurality of conductive interconnect lines 856, electrically coupling the individual one 866A of the second plurality of conductive interconnect lines 866 to the individual one 856B of the first plurality of conductive interconnect lines 856. In an embodiment, individual ones of the first plurality of conductive interconnect lines 856 are along a first direction 898 (e.g., into and out of the page), and individual ones of the second plurality of conductive interconnect lines 866 are along a second direction 899 orthogonal to the first direction 898, as is depicted. In an embodiment, the conductive via 867 includes the second conductive barrier material 868 along sidewalls and a bottom of the second conductive fill material 870, as is depicted.

In an embodiment, the second ILD layer 864 is on an etch-stop layer 872 on the first ILD layer 854. The conductive via 867 is in the second ILD layer 864 and in an opening of the etch-stop layer 872. In an embodiment, the first and second ILD layers 854 and 864 include silicon, carbon and oxygen, and the etch-stop layer 872 includes silicon and nitrogen. In an embodiment, individual ones of the first plurality of conductive interconnect lines 856 have a first width (W1), and individual ones of the second plurality of conductive interconnect lines 866 have a second width (W2) greater than the first width (W1).

In an embodiment, the second conductive fill material 870 consists essentially of copper, and the first conductive fill material 860 consists essentially of cobalt. In one such embodiment, the first conductive barrier material 858 is different in composition from the second conductive barrier material 868. In another such embodiment, the first conductive barrier material 858 is the same in composition as the second conductive barrier material 868.

In an embodiment, the first conductive fill material 860 includes copper having a first concentration of a dopant impurity atom, and the second conductive fill material 870 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 858 and the second conductive barrier material 860 have the same composition. In an embodiment, the first conductive barrier material 858 and the second conductive barrier material 868 have a different composition.

Figure 9A:
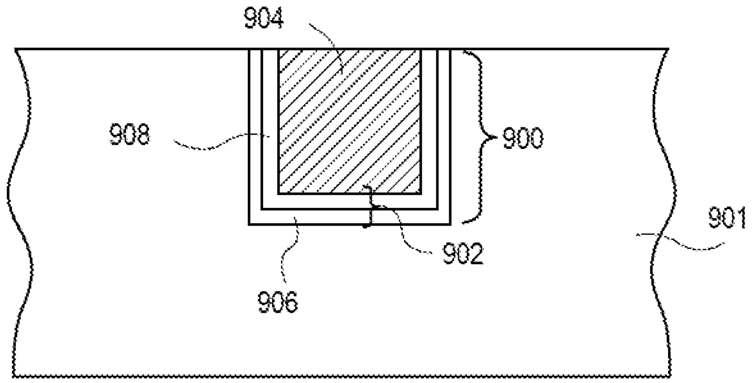
FIGS. 9A-9C illustrate cross-section views of individual interconnect lines having various liner and conductive capping structural arrangements, in accordance with an embodiment of the present disclosure.
Figure 9B:
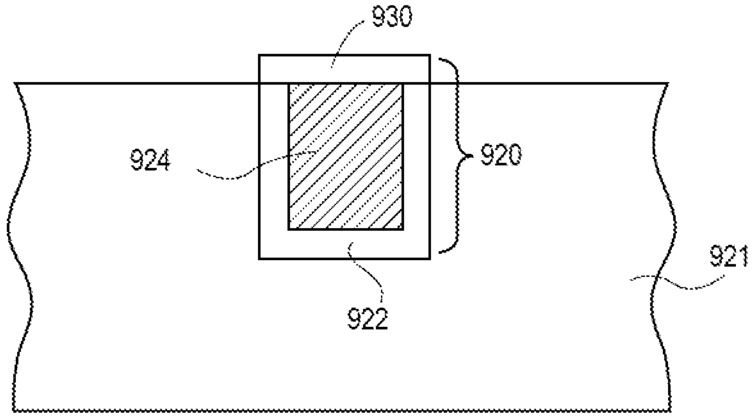
Figure 9C:
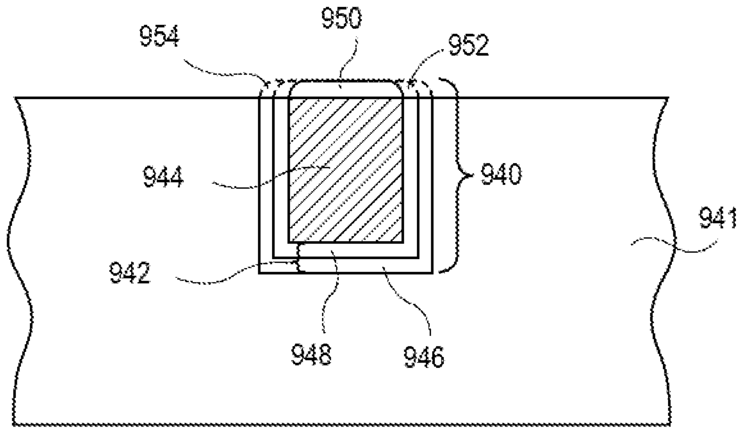

FIGS. 9A-9C illustrate cross-section views of individual interconnect lines having various barrier liner and conductive capping structural arrangements suitable for the structures described in association with FIGS. 8A and 8B, in accordance with an embodiment of the present disclosure.

Referring to FIG. 9A, an interconnect line 900 in a dielectric layer 901 includes a conductive barrier material 902 and a conductive fill material 904. The conductive barrier material 902 includes an outer layer 906 distal from the conductive fill material 904 and an inner layer 908 proximate to the conductive fill material 904. In an embodiment, the conductive fill material includes cobalt, the outer layer 906 includes titanium and nitrogen, and the inner layer 908 includes tungsten, nitrogen and carbon. In one such embodiment, the outer layer 906 has a thickness of approximately 2 nanometers, and the inner layer 908 has a thickness of approximately 0.5 nanometers. In another embodiment, the conductive fill material includes cobalt, the outer layer 906 includes tantalum, and the inner layer 908 includes ruthenium. In one such embodiment, the outer layer 906 further includes nitrogen.

Referring to FIG. 9B, an interconnect line 920 in a dielectric layer 921 includes a conductive barrier material 922 and a conductive fill material 924. A conductive cap layer 930 is on a top of the conductive fill material 924. In one such embodiment, the conductive cap layer 930 is further on a top of the conductive barrier material 922, as is depicted. In another embodiment, the conductive cap layer 930 is not on a top of the conductive barrier material 922. In an embodiment, the conductive cap layer 930 consists essentially of cobalt, and the conductive fill material 924 consists essentially of copper.

Referring to FIG. 9C, an interconnect line 940 in a dielectric layer 941 includes a conductive barrier material 942 and a conductive fill material 944. The conductive barrier material 942 includes an outer layer 946 distal from the conductive fill material 944 and an inner layer 948 proximate to the conductive fill material 944. A conductive cap layer 950 is on a top of the conductive fill material 944. In one embodiment, the conductive cap layer 950 is only a top of the conductive fill material 944. In another embodiment, however, the conductive cap layer 950 is further on a top of the inner layer 948 of the conductive barrier material 942, i.e., at location 952. In one such embodiment, the conductive cap layer 950 is further on a top of the outer layer 946 of the conductive barrier material 942, i.e., at location 954.

In an embodiment, with reference to FIGS. 9B and 9C, a method of fabricating an integrated circuit structure includes forming an inter-layer dielectric (ILD) layer 921 or 941 above a substrate. A plurality of conductive interconnect lines 920 or 940 is formed in trenches in and spaced apart by the ILD layer, individual ones of the plurality of conductive interconnect lines 920 or 940 in a corresponding one of the trenches. The plurality of conductive interconnect lines is formed by first forming a conductive barrier material 922 or 942 on bottoms and sidewalls of the trenches, and then forming a conductive fill material 924 or 944 on the conductive barrier material 922 or 942, respectively, and filling the trenches, where the conductive barrier material 922 or 942 is along a bottom of and along sidewalls of the conductive fill material 924 or 944, respectively. The top of the conductive fill material 924 or 944 is then treated with a gas including oxygen and carbon. Subsequent to treating the top of the conductive fill material 924 or 944 with the gas including oxygen and carbon, a conductive cap layer 930 or 950 is formed on the top of the conductive fill material 924 or 944, respectively.

In one embodiment, treating the top of the conductive fill material 924 or 944 with the gas including oxygen and carbon includes treating the top of the conductive fill material 924 or 944 with carbon monoxide (CO). In one embodiment, the conductive fill material 924 or 944 includes copper, and forming the conductive cap layer 930 or 950 on the top of the conductive fill material 924 or 944 includes forming a layer including cobalt using chemical vapor deposition (CVD). In one embodiment, the conductive cap layer 930 or 950 is formed on the top of the conductive fill material 924 or 944, but not on a top of the conductive barrier material 922 or 942.

In one embodiment, forming the conductive barrier material 922 or 942 includes forming a first conductive layer on the bottoms and sidewalls of the trenches, the first conductive layer including tantalum. A first portion of the first conductive layer is first formed using atomic layer deposition (ALD) and then a second portion of the first conductive layer is then formed using physical vapor deposition (PVD). In one such embodiment, forming the conductive barrier material further includes forming a second conductive layer on the first conductive layer on the bottoms and sidewalls of the trenches, the second conductive layer including ruthenium, and the conductive fill material including copper. In one embodiment, the first conductive layer further includes nitrogen.

Figure 10:
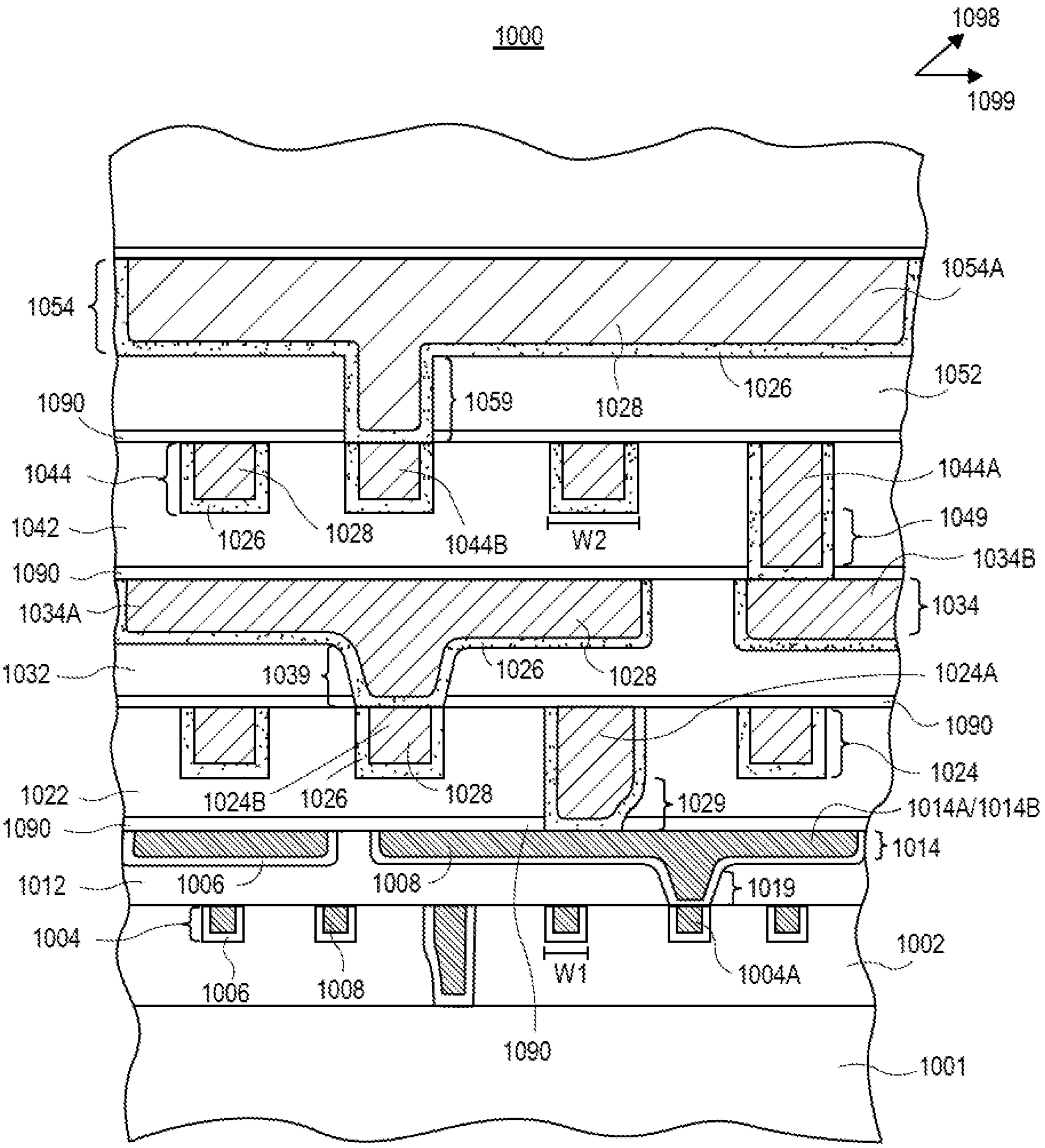
FIG. 10 illustrates a cross-sectional view of an integrated circuit structure having four metallization layers with a metal line composition and pitch above two metallization layers with a differing metal line composition and smaller pitch, in accordance with an embodiment of the present disclosure.

FIG. 10 illustrates a cross-sectional view of an integrated circuit structure having four metallization layers with a metal line composition and pitch above two metallization layers with a differing metal line composition and smaller pitch, in accordance with an embodiment of the present disclosure.

Referring to FIG. 10, an integrated circuit structure 1000 includes a first plurality of conductive interconnect lines 1004 in and spaced apart by a first inter-layer dielectric (ILD) layer 1002 above a substrate 1001. Individual ones of the first plurality of conductive interconnect lines 1004 include a first conductive barrier material 1006 along sidewalls and a bottom of a first conductive fill material 1008. Individual ones of the first plurality of conductive interconnect lines 1004 are along a first direction 1098 (e.g., into and out of the page).

A second plurality of conductive interconnect lines 1014 is in and spaced apart by a second ILD layer 1012 above the first ILD layer 1002. Individual ones of the second plurality of conductive interconnect lines 1014 include the first conductive barrier material 1006 along sidewalls and a bottom of the first conductive fill material 1008. Individual ones of the second plurality of conductive interconnect lines 1014 are along a second direction 1099 orthogonal to the first direction 1098.

A third plurality of conductive interconnect lines 1024 is in and spaced apart by a third ILD layer 1022 above the second ILD layer 1012. Individual ones of the third plurality of conductive interconnect lines 1024 include a second conductive barrier material 1026 along sidewalls and a bottom of a second conductive fill material 1028. The second conductive fill material 1028 is different in composition from the first conductive fill material 1008. Individual ones of the third plurality of conductive interconnect lines 1024 are along the first direction 1098.

A fourth plurality of conductive interconnect lines 1034 is in and spaced apart by a fourth ILD layer 1032 above the third ILD layer 1022. Individual ones of the fourth plurality of conductive interconnect lines 1034 include the second conductive barrier material 1026 along sidewalls and a bottom of the second conductive fill material 1028. Individual ones of the fourth plurality of conductive interconnect lines 1034 are along the second direction 1099.

A fifth plurality of conductive interconnect lines 1044 is in and spaced apart by a fifth ILD layer 1042 above the fourth ILD layer 1032. Individual ones of the fifth plurality of conductive interconnect lines 1044 include the second conductive barrier material 1026 along sidewalls and a bottom of the second conductive fill material 1028. Individual ones of the fifth plurality of conductive interconnect lines 1044 are along the first direction 1098.

A sixth plurality of conductive interconnect lines 1054 is in and spaced apart by a sixth ILD layer 1052 above the fifth ILD layer 1042. Individual ones of the sixth plurality of conductive interconnect lines 1054 include the second conductive barrier material 1026 along sidewalls and a bottom of the second conductive fill material 1028. Individual ones of the sixth plurality of conductive interconnect lines 1054 are along the second direction 1099.

In an embodiment, the second conductive fill material 1028 consists essentially of copper, and the first conductive fill material 1008 consists essentially of cobalt. In an embodiment, the first conductive fill material 1008 includes copper having a first concentration of a dopant impurity atom, and the second conductive fill material 1028 includes copper having a second concentration of the dopant impurity atom, the second concentration of the dopant impurity atom less than the first concentration of the dopant impurity atom.

In an embodiment, the first conductive barrier material 1006 is different in composition from the second conductive barrier material 1026. In another embodiment, the first conductive barrier material 1006 and the second conductive barrier material 1026 have the same composition.

In an embodiment, a first conductive via 1019 is on and electrically coupled to an individual one 1004A of the first plurality of conductive interconnect lines 1004. An individual one 1014A of the second plurality of conductive interconnect lines 1014 is on and electrically coupled to the first conductive via 1019.

A second conductive via 1029 is on and electrically coupled to an individual one 1014B of the second plurality of conductive interconnect lines 1014. An individual one 1024A of the third plurality of conductive interconnect lines 1024 is on and electrically coupled to the second conductive via 1029.

A third conductive via 1039 is on and electrically coupled to an individual one 1024B of the third plurality of conductive interconnect lines 1024. An individual one 1034A of the fourth plurality of conductive interconnect lines 1034 is on and electrically coupled to the third conductive via 1039.

A fourth conductive via 1049 is on and electrically coupled to an individual one 1034B of the fourth plurality of conductive interconnect lines 1034. An individual one 1044A of the fifth plurality of conductive interconnect lines 1044 is on and electrically coupled to the fourth conductive via 1049.

A fifth conductive via 1059 is on and electrically coupled to an individual one 1044B of the fifth plurality of conductive interconnect lines 1044. An individual one 1054A of the sixth plurality of conductive interconnect lines 1054 is on and electrically coupled to the fifth conductive via 1059.

In one embodiment, the first conductive via 1019 includes the first conductive barrier material 1006 along sidewalls and a bottom of the first conductive fill material 1008. The second 1029, third 1039, fourth 1049 and fifth 1059 conductive vias include the second conductive barrier material 1026 along sidewalls and a bottom of the second conductive fill material 1028.

In an embodiment, the first 1002, second 1012, third 1022, fourth 1032, fifth 1042 and sixth 1052 ILD layers are separated from one another by a corresponding etch-stop layer 1090 between adjacent ILD layers. In an embodiment, the first 1002, second 1012, third 1022, fourth 1032, fifth 1042 and sixth 1052 ILD layers include silicon, carbon and oxygen.

In an embodiment, individual ones of the first 1004 and second 1014 pluralities of conductive interconnect lines have a first width (W1). Individual ones of the third 1024, fourth 1034, fifth 1044 and sixth 1054 pluralities of conductive interconnect lines have a second width (W2) greater than the first width (W1).

It is to be appreciated that the layers and materials described above in association with back-end-of-line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (TLD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials and/or etch-stop layers are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
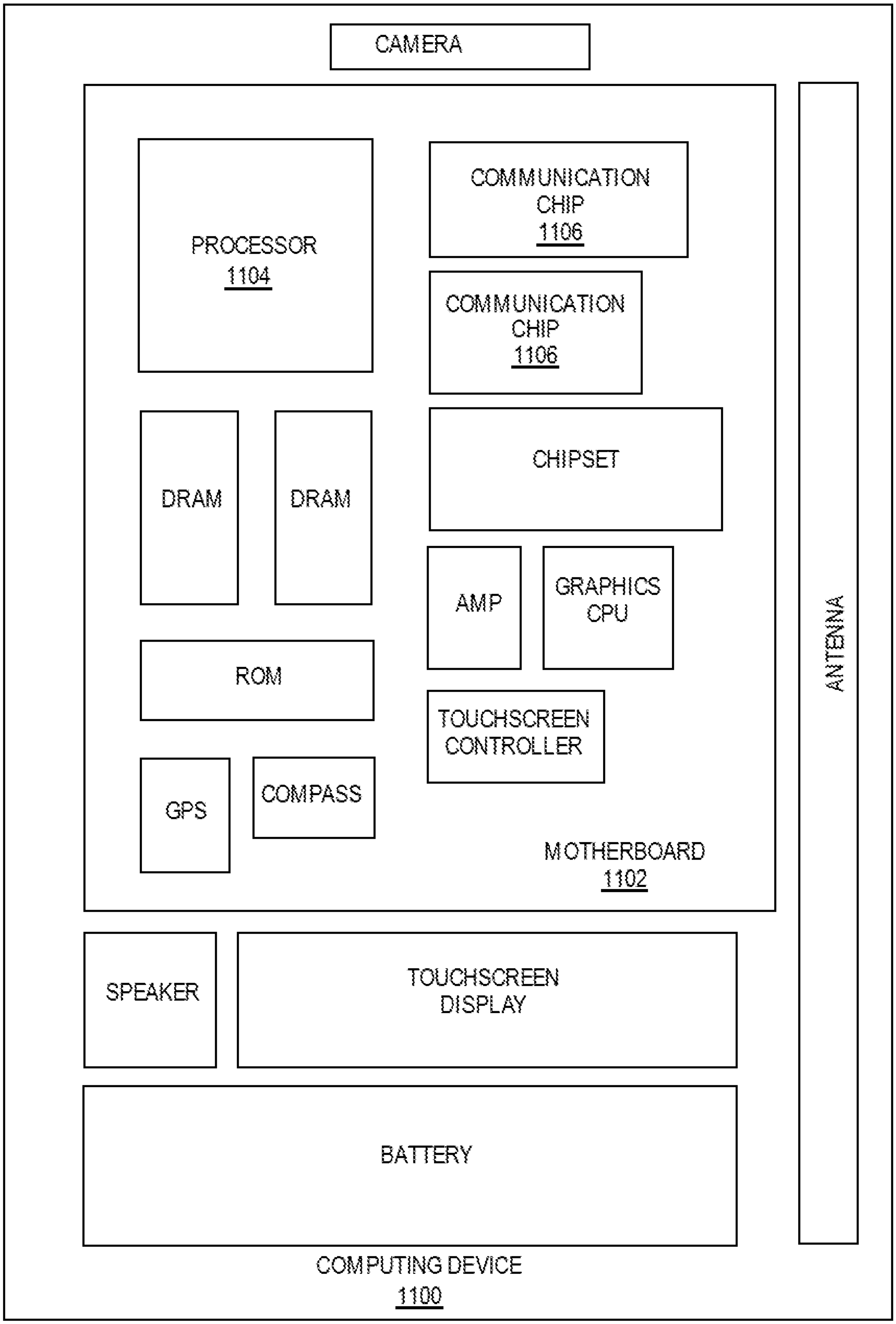
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1106 also includes an integrated circuit die packaged within the communication chip 1106. In accordance with another implementation of the disclosure, the integrated circuit die of the communication chip is built in accordance with implementations of the disclosure.

In further implementations, another component housed within the computing device 1100 may contain an integrated circuit die built in accordance with implementations of embodiments of the disclosure.

In various embodiments, the computing device 1100 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
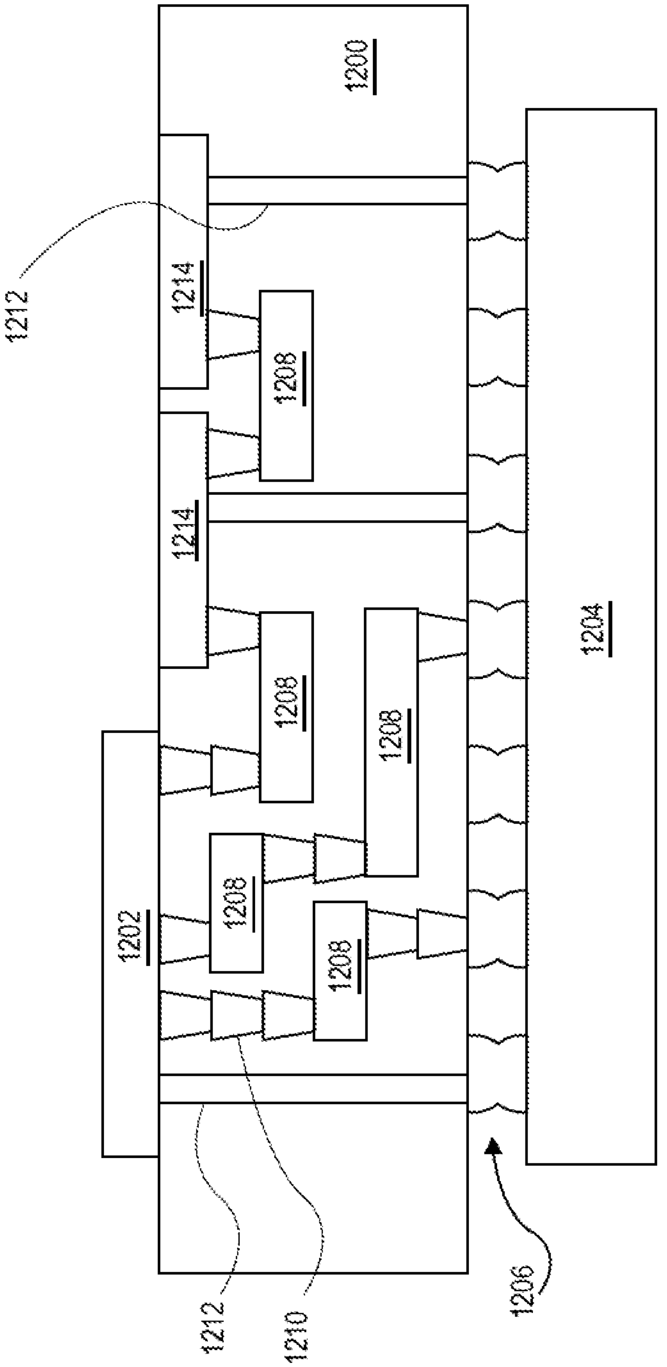
FIG. 12 illustrates an interposer that includes one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials.

The interposer 1200 may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200 or in the fabrication of components included in the interposer 1200.

Figure 13:
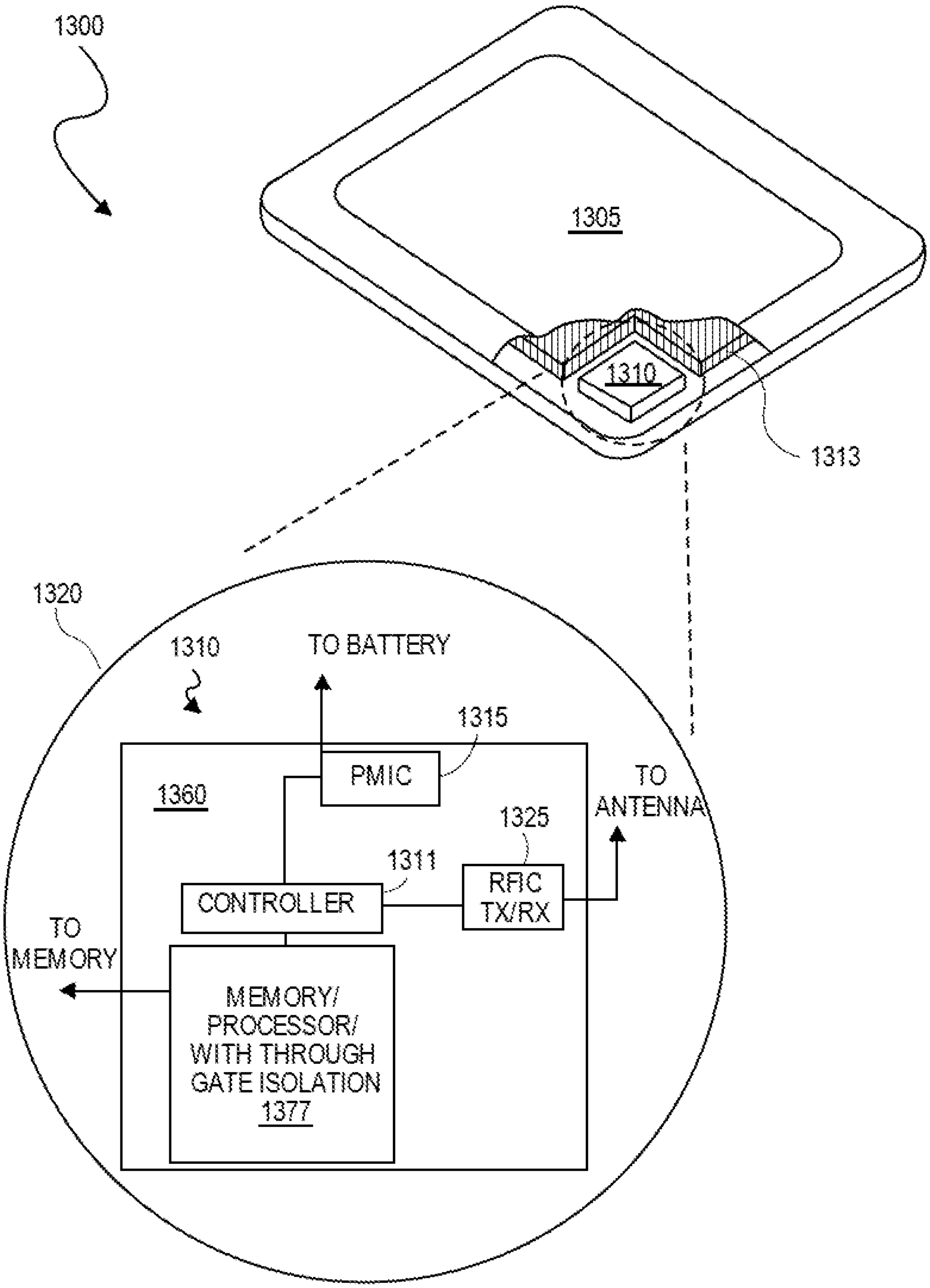
FIG. 13 is an isometric view of a mobile computing platform employing an IC fabricated according to one or more processes described herein or including one or more features described herein, in accordance with an embodiment of the present disclosure.

FIG. 13 is an isometric view of a mobile computing platform 1300 employing an integrated circuit (IC) fabricated according to one or more processes described herein or including one or more features described herein, in accordance with an embodiment of the present disclosure.

The mobile computing platform 1300 may be any portable device configured for each of electronic data display, electronic data processing, and wireless electronic data transmission. For example, mobile computing platform 1300 may be any of a tablet, a smart phone, laptop computer, etc. and includes a display screen 1305 which in the exemplary embodiment is a touchscreen (capacitive, inductive, resistive, etc.), a chip-level (SoC) or package-level integrated system 1310, and a battery 1313. As illustrated, the greater the level of integration in the system 1310 enabled by higher transistor packing density, the greater the portion of the mobile computing platform 1300 that may be occupied by the battery 1313 or non-volatile storage, such as a solid state drive, or the greater the transistor gate count for improved platform functionality. Similarly, the greater the carrier mobility of each transistor in the system 1310, the greater the functionality. As such, techniques described herein may enable performance and form factor improvements in the mobile computing platform 1300.

The integrated system 1310 is further illustrated in the expanded view 1320. In the exemplary embodiment, packaged device 1377 includes at least one memory chip (e.g., RAM), or at least one processor chip (e.g., a multi-core microprocessor and/or graphics processor) fabricated according to one or more processes described herein or including one or more features described herein. The packaged device 1377 is further coupled to the board 1360 along with one or more of a power management integrated circuit (PMIC) 1315, RF (wireless) integrated circuit (RFIC) 1325 including a wideband RF (wireless) transmitter and/or receiver (e.g., including a digital baseband and an analog front end module further includes a power amplifier on a transmit path and a low noise amplifier on a receive path), and a controller thereof 1311. Functionally, the PMIC 1315 performs battery power regulation, DC-to-DC conversion, etc., and so has an input coupled to the battery 1313 and with an output providing a current supply to all the other functional modules. As further illustrated, in the exemplary embodiment, the RFIC 1325 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1377 or within a single IC (SoC) coupled to the package substrate of the packaged device 1377.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 14:
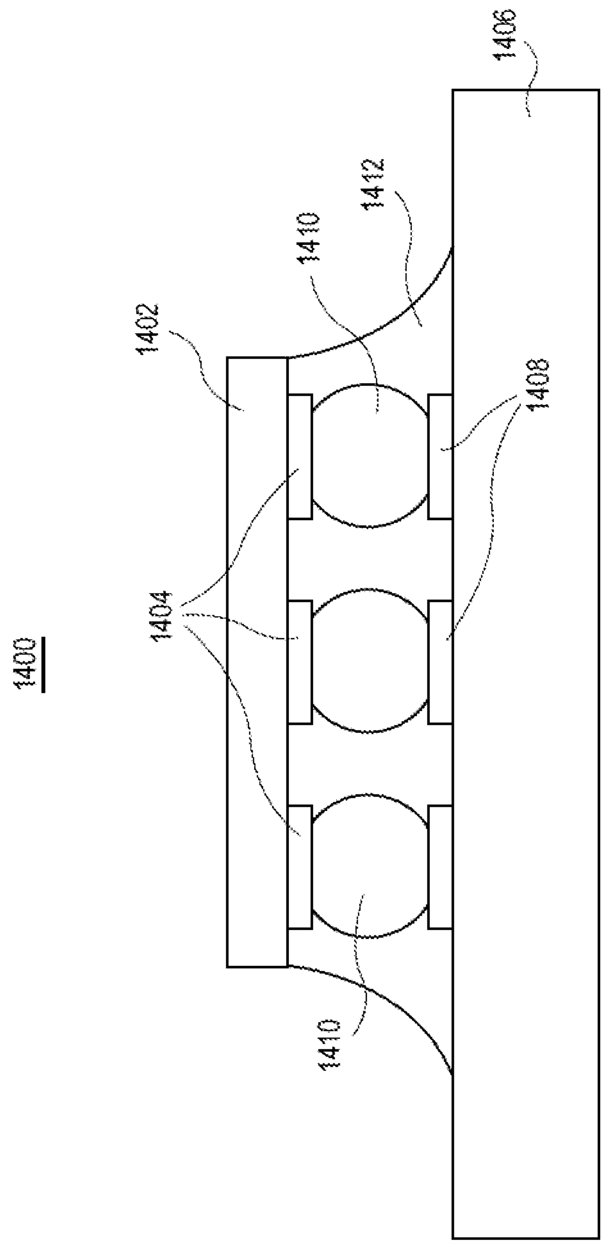
FIG. 14 illustrates a cross-sectional view of a flip-chip mounted die, in accordance with an embodiment of the present disclosure.

FIG. 14 illustrates a cross-sectional view of a flip-chip mounted die, in accordance with an embodiment of the present disclosure.

Referring to FIG. 14, an apparatus 1400 includes a die 1402 such as an integrated circuit (IC) fabricated according to one or more processes described herein or including one or more features described herein, in accordance with an embodiment of the present disclosure. The die 1402 includes metallized pads 1404 thereon. A package substrate 1406, such as a ceramic or organic substrate, includes connections 1408 thereon. The die 1402 and package substrate 1406 are electrically connected by solder balls 1410 coupled to the metallized pads 1404 and the connections 1408. An underfill material 1412 surrounds the solder balls 1410.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication, including dielectric plug approaches for integrated circuit structure fabrication and the resulting structures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of conductive lines along a same direction, one of the conductive lines having a break therein. An inter-layer dielectric (ILD) structure has portions between adjacent ones of the plurality of conductive lines and has a dielectric plug portion in a location of the break in the one of the conductive lines. The dielectric plug portion of the ILD structure is continuous with one or more of the portions of the ILD structure between adjacent ones of the plurality of conductive lines. The dielectric plug portion of the ILD structure has an inwardly tapering profile from top to bottom.

Example embodiment 2: The integrated circuit structure of example embodiment 1, wherein the plurality of conductive lines includes a conductive barrier and a conductive fill.

Example embodiment 3: The integrated circuit structure of example embodiment 1, wherein the ILD structure is on a dielectric hardmask layer.

Example embodiment 4: The integrated circuit structure of example embodiment 3, wherein the dielectric hardmask layer extends laterally beyond the bottom of the dielectric plug portion of the ILD structure.

Example embodiment 5: The integrated circuit structure of example embodiment 3 or 4, wherein the dielectric plug portion of the ILD structure is on a portion of the dielectric hardmask layer having a first thickness, the portions of the ILD structure between adjacent ones of the plurality of conductive lines are on a portion of the dielectric hardmask layer having a second thickness, the second thickness greater than the first thickness.

Example embodiment 6: The integrated circuit structure of example embodiment 3, 4 or 5, wherein the dielectric hardmask layer includes silicon, nitrogen and oxygen.

Example embodiment 7: An integrated circuit structure includes a plurality of conductive lines along a same direction, one of the conductive lines having a break therein. A dielectric hardmask layer has portions between adjacent ones of the plurality of conductive lines and has a portion in a location of the break in the one of the conductive lines. An inter-layer dielectric (ILD) structure is on the dielectric hardmask layer, the ILD structure having portions between adjacent ones of the plurality of conductive lines and having a dielectric plug portion in the location of the break in the one of the conductive lines. The dielectric plug portion of the ILD structure is continuous with one or more of the portions of the ILD structure between adjacent ones of the plurality of conductive lines. The dielectric plug portion of the ILD structure is on a portion of the dielectric hardmask layer having a first thickness, and the portions of the ILD structure between adjacent ones of the plurality of conductive lines are on a portion of the dielectric hardmask layer having a second thickness, the second thickness greater than the first thickness.

Example embodiment 8: The integrated circuit structure of example embodiment 7, wherein the plurality of conductive lines includes a conductive barrier and a conductive fill.

Example embodiment 9: The integrated circuit structure of example embodiment 7 or 8, wherein the portion of the dielectric hardmask layer in the location of the break in the one of the conductive lines extends laterally beyond a bottom of the dielectric plug portion of the ILD structure.

Example embodiment 10: The integrated circuit structure of example embodiment 7, 8 or 9, wherein the dielectric hardmask layer includes silicon, nitrogen and oxygen.

Example embodiment 11: A computing device includes a board, and a component coupled to the board. The component includes an integrated circuit structure including a plurality of conductive lines along a same direction, one of the conductive lines having a break therein. An inter-layer dielectric (ILD) structure has portions between adjacent ones of the plurality of conductive lines and has a dielectric plug portion in a location of the break in the one of the conductive lines. The dielectric plug portion of the ILD structure is continuous with one or more of the portions of the ILD structure between adjacent ones of the plurality of conductive lines. The dielectric plug portion of the ILD structure has an inwardly tapering profile from top to bottom.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure, the integrated circuit structure including a plurality of conductive lines along a same direction, one of the conductive lines having a break therein. A dielectric hardmask layer has portions between adjacent ones of the plurality of conductive lines and has a portion in a location of the break in the one of the conductive lines. An inter-layer dielectric (ILD) structure is on the dielectric hardmask layer, the ILD structure having portions between adjacent ones of the plurality of conductive lines and having a dielectric plug portion in the location of the break in the one of the conductive lines. The dielectric plug portion of the ILD structure is continuous with one or more of the portions of the ILD structure between adjacent ones of the plurality of conductive lines. The dielectric plug portion of the ILD structure is on a portion of the dielectric hardmask layer having a first thickness, and the portions of the ILD structure between adjacent ones of the plurality of conductive lines are on a portion of the dielectric hardmask layer having a second thickness, the second thickness greater than the first thickness.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:

a plurality of conductive lines along a same direction, one of the conductive lines having a break therein; and an inter-layer dielectric (ILD) structure having portions between adjacent ones of the plurality of conductive lines and having a dielectric plug portion in a location of the break in the one of the conductive lines, the dielectric plug portion of the ILD structure continuous with one or more of the portions of the ILD structure between adjacent ones of the plurality of conductive lines, and the dielectric plug portion of the ILD structure having an inwardly tapering profile from top to bottom, wherein the ILD structure is on a dielectric hardmask layer, and wherein the dielectric plug portion of the ILD structure is on a portion of the dielectric hardmask layer having a first thickness, the portions of the ILD structure between adjacent ones of the plurality of conductive lines are on a portion of the dielectric hardmask layer having a second thickness, the second thickness greater than the first thickness.

2. The integrated circuit structure of claim 1, wherein the plurality of conductive lines comprises a conductive barrier and a conductive fill.

3. The integrated circuit structure of claim 1, wherein the dielectric hardmask layer extends laterally beyond the bottom of the dielectric plug portion of the ILD structure.

4. The integrated circuit structure of claim 1, wherein the dielectric hardmask layer comprises silicon, nitrogen and oxygen.

5. An integrated circuit structure, comprising:

a plurality of conductive lines along a same direction, one of the conductive lines having a break therein;

a dielectric hardmask layer having portions between adjacent ones of the plurality of conductive lines and having a portion in a location of the break in the one of the conductive lines; and an inter-layer dielectric (ILD) structure on the dielectric hardmask layer, the ILD structure having portions between adjacent ones of the plurality of conductive lines and having a dielectric plug portion in the location of the break in the one of the conductive lines, the dielectric plug portion of the ILD structure continuous with one or more of the portions of the ILD structure between adjacent ones of the plurality of conductive lines, wherein the dielectric plug portion of the ILD structure is on a portion of the dielectric hardmask layer having a first thickness, and the portions of the ILD structure between adjacent ones of the plurality of conductive lines are on a portion of the dielectric hardmask layer having a second thickness, the second thickness greater than the first thickness.

6. The integrated circuit structure of claim 5, wherein the plurality of conductive lines comprises a conductive barrier and a conductive fill.

7. The integrated circuit structure of claim 5, wherein the portion of the dielectric hardmask layer in the location of the break in the one of the conductive lines extends laterally beyond a bottom of the dielectric plug portion of the ILD structure.

8. The integrated circuit structure of claim 5, wherein the dielectric hardmask layer comprises silicon, nitrogen and oxygen.

9. A computing device, comprising:

a board; and a component coupled to the board, the component including an integrated circuit structure, comprising:

a plurality of conductive lines along a same direction, one of the conductive lines having a break therein; and an inter-layer dielectric (ILD) structure having portions between adjacent ones of the plurality of conductive lines and having a dielectric plug portion in a location of the break in the one of the conductive lines, the dielectric plug portion of the ILD structure continuous with one or more of the portions of the ILD structure between adjacent ones of the plurality of conductive lines, and the dielectric plug portion of the ILD structure having an inwardly tapering profile from top to bottom, wherein the ILD structure is on a dielectric hardmask layer, and wherein the dielectric plug portion of the ILD structure is on a portion of the dielectric hardmask layer having a first thickness, the portions of the ILD structure between adjacent ones of the plurality of conductive lines are on a portion of the dielectric hardmask layer having a second thickness, the second thickness greater than the first thickness.

10. The computing device of claim 9, further comprising:

a memory coupled to the board.

11. The computing device of claim 9, further comprising:

a communication chip coupled to the board.

12. The computing device of claim 9, further comprising:

a camera coupled to the board.

13. The computing device of claim 9, wherein the component is a packaged integrated circuit die.

14. A computing device, comprising:

a board; and a component coupled to the board, the component including an integrated circuit structure, the integrated circuit structure comprising:

a plurality of conductive lines along a same direction, one of the conductive lines having a break therein;

a dielectric hardmask layer having portions between adjacent ones of the plurality of conductive lines and having a portion in a location of the break in the one of the conductive lines; and an inter-layer dielectric (ILD) structure on the dielectric hardmask layer, the ILD structure having portions between adjacent ones of the plurality of conductive lines and having a dielectric plug portion in the location of the break in the one of the conductive lines, the dielectric plug portion of the ILD structure continuous with one or more of the portions of the ILD structure between adjacent ones of the plurality of conductive lines, wherein the dielectric plug portion of the ILD structure is on a portion of the dielectric hardmask layer having a first thickness, and the portions of the ILD structure between adjacent ones of the plurality of conductive lines are on a portion of the dielectric hardmask layer having a second thickness, the second thickness greater than the first thickness.

15. The computing device of claim 14, further comprising:

a memory coupled to the board.

16. The computing device of claim 14, further comprising:

a communication chip coupled to the board.

17. The computing device of claim 14, further comprising:

a camera coupled to the board.

18. The computing device of claim 14, wherein the component is a packaged integrated circuit die.

* * * * *